US012170288B2

(12) United States Patent
Yamaguchi

(10) Patent No.: US 12,170,288 B2
(45) Date of Patent: Dec. 17, 2024

(54) SEMICONDUCTOR DEVICE

(71) Applicant: Japan Display Inc., Tokyo (JP)

(72) Inventor: Yohei Yamaguchi, Tokyo (JP)

(73) Assignee: Japan Display Inc., Tokyo (JP)

( * ) Notice: Subject to any disclaimer, the term of this patent is extended or adjusted under 35 U.S.C. 154(b) by 16 days.

(21) Appl. No.: 17/958,515

(22) Filed: Oct. 3, 2022

(65) Prior Publication Data

US 2023/0027596 A1 Jan. 26, 2023

Related U.S. Application Data

(63) Continuation of application No. 16/733,435, filed on Jan. 3, 2020, now Pat. No. 11,488,984.

(30) Foreign Application Priority Data

Jan. 10, 2019 (JP) ................. 2019-002537

(51) Int. Cl.
*H01L 27/12* (2006.01)
*G02F 1/1333* (2006.01)
*G02F 1/1362* (2006.01)
*H01L 21/02* (2006.01)
(Continued)

(52) U.S. Cl.
CPC ...... *H01L 27/124* (2013.01); *G02F 1/133345* (2013.01); *G02F 1/136227* (2013.01); *G02F 1/136286* (2013.01); *H01L 21/02554* (2013.01); *H01L 21/02565* (2013.01); *H01L 21/31116* (2013.01); *H01L 21/822* (2013.01);
(Continued)

(58) Field of Classification Search
CPC ....... H01L 2924/00; H01L 2224/32225; H01L 2224/73204; H01L 2224/97; H01L 2224/16225; H01L 21/02554; H01L 21/02565; H01L 21/31116; H01L 21/822; H01L 27/1225
See application file for complete search history.

(56) References Cited

U.S. PATENT DOCUMENTS

| 2011/0212569 | A1  | 9/2011 | Yamazaki et al. |
| 2012/0205678 | A1* | 8/2012 | Ikeda ............ H10K 50/805 |
|              |     |        | 438/22 |
| 2013/0208205 | A1  | 8/2013 | Misaki |

(Continued)

OTHER PUBLICATIONS

English translation of Chinese Office Action dated Mar. 6, 2023, issued in Chinese Application No. 201911403498.5.
(Continued)

*Primary Examiner* — Tony Tran
(74) *Attorney, Agent, or Firm* — Michael Best & Friedrich LLP

(57) ABSTRACT

A wiring structure includes a structure body including a pattern, a first conductive layer above the structure body, the first conductive layer having a shape, the shape crossing an edge of a pattern of the structure body and reflecting a step of the edge of the pattern of the structure body, a first insulating layer above the first conductive layer, the first insulating layer having a first opening overlapping the edge of the pattern of the structure body in a plane view, and r is arranged with a second opening in a region overlapping the semiconductor layer in a plane view, a second conductive layer in the first opening, the second conductive layer being connected to the first conductive layer.

4 Claims, 25 Drawing Sheets

(51) Int. Cl.
*H01L 21/311* (2006.01)
*H01L 21/822* (2006.01)

(52) U.S. Cl.
CPC .... *H01L 27/1225* (2013.01); *G02F 1/136295* (2021.01); *G02F 2201/123* (2013.01)

(56) References Cited

U.S. PATENT DOCUMENTS

| | | | |
|---|---|---|---|
| 2015/0001507 A1* | 1/2015 | Kim | H10K 59/12 438/34 |
| 2015/0349127 A1 | 12/2015 | Kurata et al. | |
| 2018/0120658 A1* | 5/2018 | Kanaya | G02F 1/136227 |
| 2019/0393354 A1* | 12/2019 | Nakazawa | H01L 21/02274 |

OTHER PUBLICATIONS

Japanese Office Action dated Nov. 8, 2022, issued for JP Application No. 2019-002537, with English machine translation.

* cited by examiner

SEMICONDUCTOR DEVICE

CROSS REFERENCE TO RELATED APPLICATIONS

This application is a continuation of U.S. patent application Ser. No. 16/733,435 filed on Jan. 3, 2020. Further, this application is based upon and claims the benefit of priority from the prior Japanese Patent Application No. 2019-002537, filed on Jan. 10, 2019, the entire contents of which are incorporated herein by reference.

FIELD

One embodiment of the present invention is related to a wiring structure and a semiconductor device including the wiring structure, and a display device including the semiconductor device. In particular, one embodiment of the present invention is related a wiring structure arranged with a contact structure connecting conductive layers arranged on different layers, a semiconductor device and a display device.

BACKGROUND

A semiconductor device such as a transistor is used in a pixel circuit and a drive circuit of a display device. Wiring having a structure in which a plurality of conductive layers and a plurality of insulating layers are stacked is employed as the wiring of the semiconductor device. Each of the plurality of conductive layers is patterned and connected to each other to form the wiring. The pixel circuit and the drive circuit described above are formed by connecting a plurality of semiconductor devices by this wiring.

In a wiring structure which forms the wiring described above, a contact structure for ensuring conduction between different conductive layers is very important. For example, the contact structures shown in Japanese Laid Open Patent Publication No. H-11-233627, Japanese Laid Open Patent Publication No. H10-335581 and Japanese Laid Open Patent Publication No. H7-142493 have been proposed as such a contact structure.

As described above, a contact structure for ensuring conduction between different conductive layers is very important for realizing a semiconductor device having stable operation and high reliability. However, in the contact structures disclosed in Japanese Laid Open Patent Publication No. H11-233627, Japanese Laid Open Patent Publication No. H10-335581 and Japanese Laid Open Patent Publication No. H7-142493, when a cleaning process or a chemical process is performed after an opening is formed in an insulating layer so that a part of a lower conductive layer is exposed, the conductive layer exposed from the insulating layer may be etched, and a conduction failure between the lower conductive layer and the upper conductive layer may occur.

SUMMARY

A wiring structure in an embodiment according to the present invention includes a structure body including a pattern, a first conductive layer above the structure body, the first conductive layer having a shape, the shape crossing an edge of a pattern of the structure body and reflecting a step of the edge of the pattern of the structure body, a first insulating layer above the first conductive layer, the first insulating layer having a first opening overlapping the edge of the pattern of the structure body in a plane view, and a second conductive layer in the first opening, the second conductive layer being connected to the first conductive layer.

A wiring structure in an embodiment according to the present invention includes a first conductive layer, a second oxide semiconductor layer above the first conductive layer, a first insulating layer above the second oxide semiconductor layer, the first insulating layer having a first opening overlapping the first conductive layer in a plane view, and a second conductive layer in the first opening, the second conductive layer being connected to the first conductive layer, wherein a gap is arranged between the first conductive layer and the first insulating layer and is surrounded by the second oxide semiconductor layer, and a region where the first conductive layer and the second conductive layer contact is surrounded by the gap in a plane view.

A semiconductor device in an embodiment according to the present invention includes a wiring structure according described above, a first oxide semiconductor layer connected to the first conductive layer, a gate electrode opposing the first oxide semiconductor layer, a gate insulating layer between the first oxide semiconductor layer and the gate electrode, and a third conductive layer connected to the first oxide semiconductor layer, wherein the first oxide semiconductor layer is arranged between the first conductive layer and the third conductive layer.

A display device in an embodiment according to the present invention includes a semiconductor described above, a third insulating layer above the semiconductor device, the third insulating layer having a fourth opening, and a pixel electrode above the third insulating layer and in the fourth opening is connected to the third conductive layer.

DESCRIPTION OF EMBODIMENTS

Figure 1:
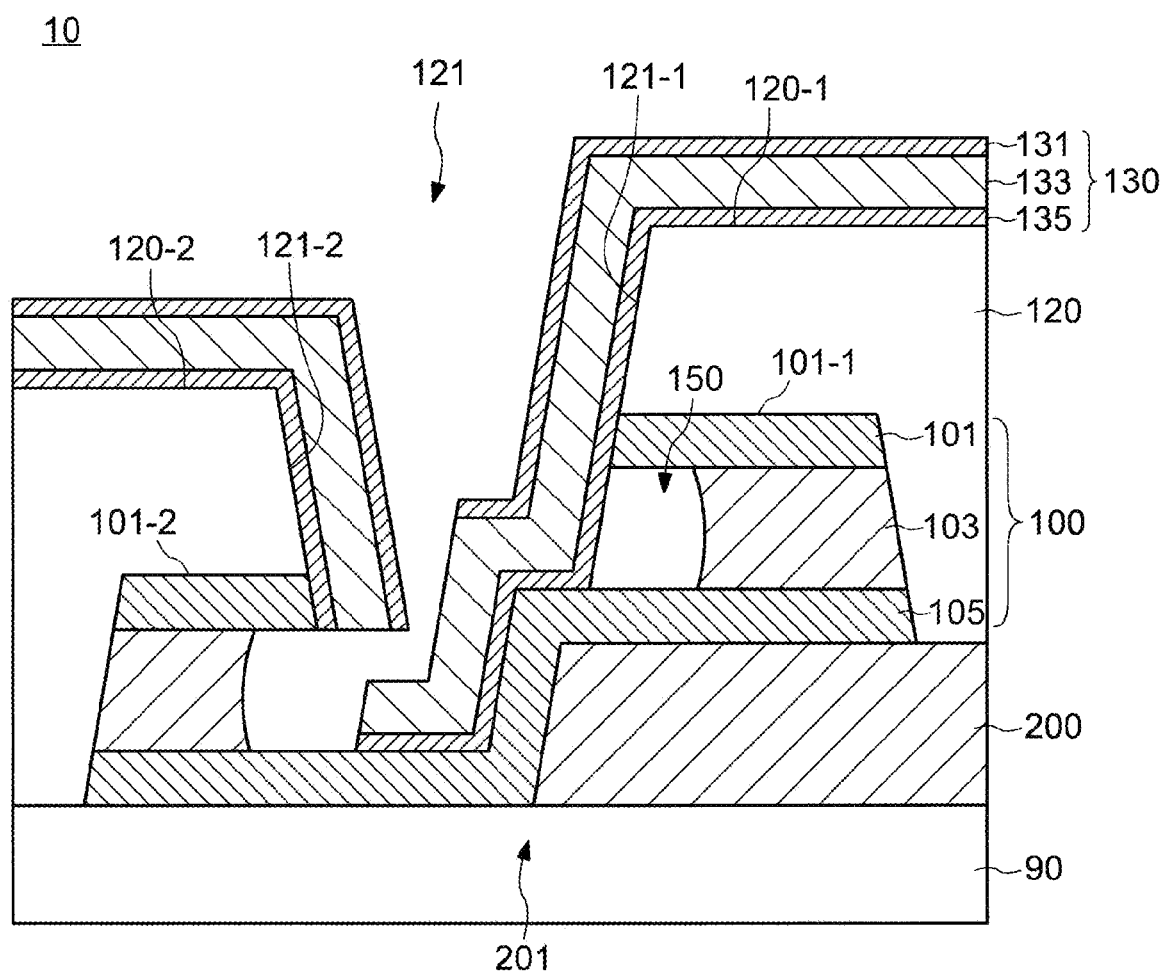
FIG. 1 is a cross-sectional diagram showing a summary of a wiring structure related to one embodiment of the present invention.

Each embodiment of the present invention is explained below while referring to the drawings. However, the disclosure herein is only an example and a structure easily arrived at by a person skilled in the art by making appropriate modifications without departing from the concept of the invention is naturally to be contained in the scope of the present invention. The drawings may be schematically represented with the width, thickness, shape and the like of each part as compared with the actual form in order to clarify the explanation more clearly. However, they are only an example and do not limit an interpretation of the present invention. In the specification and drawings, elements having the same functions as those described with reference to preceding figures are attached with a letter of the alphabet after the same reference symbol and a detailed explanation may be omitted as appropriate.

In each embodiment of the present invention, a direction from a base layer towards the wiring structure or a direction from a transistor towards a pixel electrode is referred to as "up" or "above". Conversely, a direction from the wiring structure towards the base layer, or a direction from a pixel electrode towards a transistor is referred to as "down" or "below". As described above, for the convenience of explanation, although an explanation is made using the terms "upper" or "lower", for example, the vertical relationship between the base layer and the wiring structure may be reversed. In the explanation below, for example, the expression "wiring structure on the base layer" merely describes the vertical relationship between the base layer and the wiring structure as described above, other members may also be arranged between the base layer and the wiring structure. Upper or lower means the stacking order in a structure in which a plurality of layers is stacked, and in the case when a pixel electrode is expressed as above a transistor, it may be a positional relationship in which the transistor and the pixel electrode do not overlap in a plane view. On the other hand, when a pixel electrode is expressed vertically above a transistor, it means a positional relationship in which the transistor and the pixel electrode overlap in a plane view.

The "wiring structure" is a part of wiring which configures with a circuit in which a conductive layer is patterned. For example, a wiring structure refers to a structure in which conductive layers arranged in different layers separated by an insulating layer are mutually connected to each other through an opening which is arranged in the insulating layer. In the present embodiment, although a structure is exemplified in which there are two conductive layers included in the wiring structure, the conductive layer may be three or more layers.

"Display device" refers to a structure that displays an image using an electro-optic layer. For example, the term "display device" may refer to a display panel including an electro-optical layer, or a structure in which another optical member (for example, a polarizing member, a backlight, a touch panel, or the like) is attached to a display cell. The "electro-optic layer" may include a liquid crystal layer, an electroluminescence (EL) layer, an electrochromic (EC) layer, and an electrophoretic layer as long as no technical contradiction occurs. Therefore, the embodiments described later will be described by exemplifying a liquid crystal display device including a liquid crystal layer and an organic EL display device including an organic EL layer as a display device. The present invention can be applied to a display device including the electro-optic layer mentioned above.

In the present specification, the expressions "a includes A, B or C", "a includes any of A, B and C", and "a includes one selected from the group consisting of A, B and C" unless otherwise stated does not exclude the case where a includes a plurality of combinations of A to C. Furthermore, these expressions do not exclude the case where a includes other elements.

Furthermore, each of the following embodiments can be combined with each other as long as no technical contradiction occurs.

One embodiment of the present invention is to realize a wiring structure arranged with a contact structure for ensuring conduction between different conductive layers which are stacked, a semiconductor device including the wiring structure, and a display device including the semiconductor device.

First Embodiment

A wiring structure and a manufacturing method of a wiring structure related to one embodiment of the present invention is explained using FIG. 1 to FIG. 5. The wiring structure of the embodiments shown herein may also use an integrated circuit (IC) such as a micro-processing unit (MPU) or a memory circuit in addition to a semiconductor device such as a transistor used in a display device.

(Structure of Wiring Structure 10)

Figure 2:
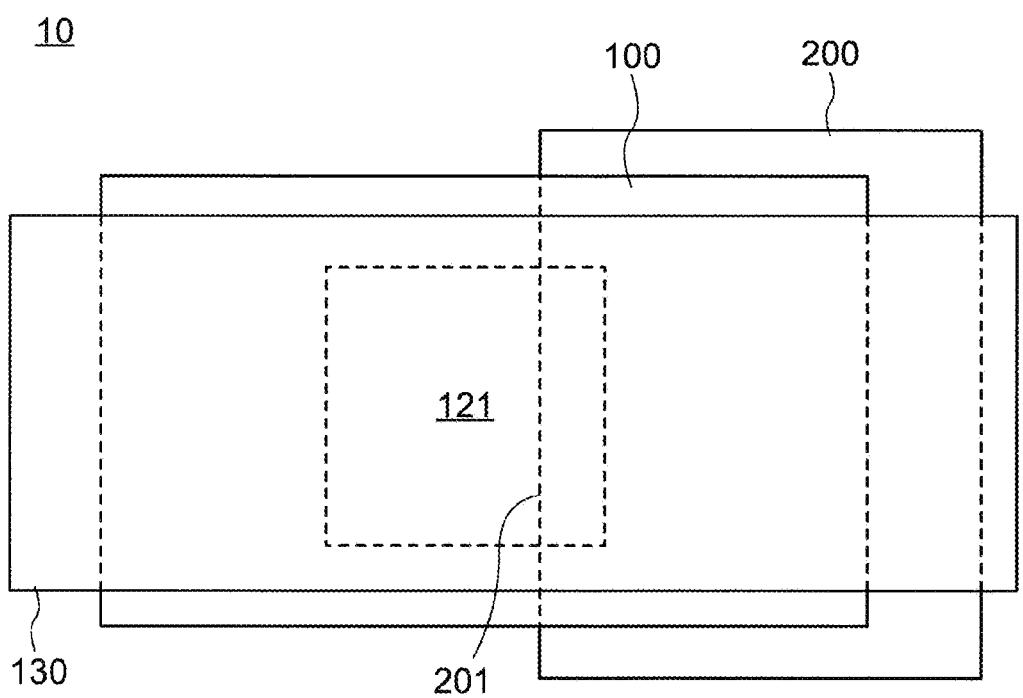
FIG. 2 is a plane view diagram showing a summary of a wiring structure related to one embodiment of the present invention.

A structure of the wiring structure related to one embodiment of the present invention is explained using FIG. 1 and FIG. 2. FIG. 1 is a cross-sectional diagram showing a summary of a wiring structure according to one embodiment of the present invention. FIG. 2 is a plane view diagram showing a summary of a wiring structure according to one embodiment of the present invention.

As is shown in FIG. 1, the wiring structure 10 is arranged above the base layer 90. The wiring structure 10 includes a structure body 200 having a pattern, a first conductive layer 100, a first insulating layer 120 and a second conductive layer 130. The structure body 200 is arranged above the base layer 90. The first conductive layer 100 is arranged above the structure body 200. The first conductive layer 100 crosses the pattern edge part 201 of the structure body 200. The first conductive layer 100 has a shape formed by the structure body 200 and reflects the step of the pattern edge part 201 of the structure body 200. In other words, the first conductive layer 100 is arranged on the upper surface of the structure body 200, the upper surface of the base layer 90 which is not arranged with the structure body 200, and the pattern edge part 201 of the structure body 200 (that is, the side surface of the structure body 200). The first conductive layer 100 has a continuous shape along these surfaces. As a result, an upper surface 101-1 of the first conductive layer 100 in a region where the structure body 200 is arranged (that is, vertically above the structure body 200) exists further above an upper surface 101-2 (a position far from the base layer 90) of the first conductive layer 100 in the region where the structure body 200 is not arranged.

The first insulating layer 120 is provided above the base layer 90, the structure body 200 and the first conductive layer 100. Similar to the first conductive layer 100, the first insulating layer 120 has a shape formed by the structure body 200 and reflects a step of the pattern edge 201 of the structure body 200. That is, an upper surface 120-1 of the first insulating layer 120 in the region where the structure body 200 is arranged exists further above an upper surface 120-2 of the first insulating layer 120 in the region where the structure body 200 is not arranged (position far from the base layer 90).

A first opening 121 is arranged in the first insulating layer 120. As is shown in FIG. 2, the first opening 121 overlaps the pattern edge part 201 of the structure body 200 in a plane view. In other words, the pattern edge part 201 crosses the first opening 121.

The first conductive layer 100 includes a first film 101 a second film 103 and a third film 105. The second film 103 is arranged below the first film 101. The third film 105 is arranged below the second film 103. In the example in FIG. 1, the second film 103 is side-etched in a horizontal direction further than an end part of the first film 101. As a result, a gap 150 is formed in a region surrounded by the first film 101, the second film 103, the third film 105 and the second conductive layer 130. In other words, a part of the surface of the first film 101 on the second film 103 side is exposed from the second film 103. The second conductive layer 130 is in contact with the third film 105. Similar to the first conductive layer 100, the second conductive layer 130 includes a first film 131, a second film 133 and a third film 135. The film thicknesses of the first film 101, the third film 105, the first film 131 and the third film 135 are 10 nm or more and 100 nm or less. The film thicknesses of the second film 103 and the second film 133 are 50 nm or more and 500 nm or less.

A material having higher chemical resistance than the second film 103 and is difficult to oxidize is used as the first film 101 and the third film 105. Similarly, a material having higher chemical resistance than the second film 133 and is difficult to oxidize is used as the first film 131 and the third film 135. For example, titanium (Ti), chromium (Cr), cobalt (Co), nickel (Ni), molybdenum (Mo) Hafnium (Hf), tantalum (Ta), tungsten (W), bismuth (Bi), and alloys or compounds of these are used as the first film 101, the third film 105, the first film 131 and the third film 135. A material having a resistance lower than the first film 101 and the third film 105 is used as the second film 103. Similarly, a material having a resistance lower than the first film 131 and the third film 135 is used as the second film 133. For example, aluminum (Al), copper (Cu), silver (Ag) and alloys of these are used as the second film 103 and the second film 133.

In the present embodiment, although a structure is exemplified in which three films are stacked as the first conductive layer 100 and the second conductive layer 130, the present invention is not limited to this structure. For example, each of the first conductive layer 100 and the second conductive layer 130 may have a stacked structure in which four or more films are stacked, a stacked structure in which two films are stacked, or a single layer structure formed from one film.

As is shown in FIG. 1, the second conductive layer 130 is arranged above the first insulating layer 120 and on the inside of the first opening 121. The second conductive layer 130 is connected to the first conductive layer 100 as described above at or below the bottom of the first opening 121. In FIG. 1, the second conductive layer 130 is continuous from the side wall 121-1 of the first opening 121 to the third film 105. The side wall 121-1 is a side wall of the first opening 121 in a region where the structure body 200 is arranged. On the other hand, the second conductive layer 130 is in contact with only the first film 101 and the lower part of the second conductive layer 130 is disconnected at the side wall 121-2 of the first opening 121. The side wall 121-2 is a side wall of the first opening 121 in a region where the structure body 200 is not arranged. However, as is explained in detail herein, the second conductive layer 130 which is arranged on the side wall 121-2 may continue up to the third film 105.

Although FIG. 1 exemplifies a structure in which all of the films of the first film 131, the second film 133 and the third film 135 included in the second conductive layer 130 are continuous from the side wall 121-1 to the third film 105, the present embodiment is not limited to this structure. For example, any one film among the plurality of films included in the second conductive layer 130 may also be continuous from the side wall 121-1 to the third film 105, and all of the plurality of films do not need to be continuous.

In the present embodiment, even if the second film 103 is side-etched in a horizontal direction further than the end of the first film 101, a structure is explained in which it is possible to ensure contact between the second conductive layer 130 and the first conductive layer 100 which is exposed by the first opening 121. However, the second film 103 does not have to be side-etched in a horizontal direction further than the end of the first film 101, and the gap 150 may not be arranged.

Although described in detail herein, in the case where the wiring structure 10 is applied to a source electrode and a drain electrode of a transistor in which an oxide semiconductor layer is used as a channel, the structure body 200 may be formed by a part of the oxide semiconductor layer used as a channel. In this case, the oxide semiconductor layer which is used as the channel and the structure body 200 may be called a "first oxide semiconductor layer".

Manufacturing Method of Wiring Structure 10

Figure 3:
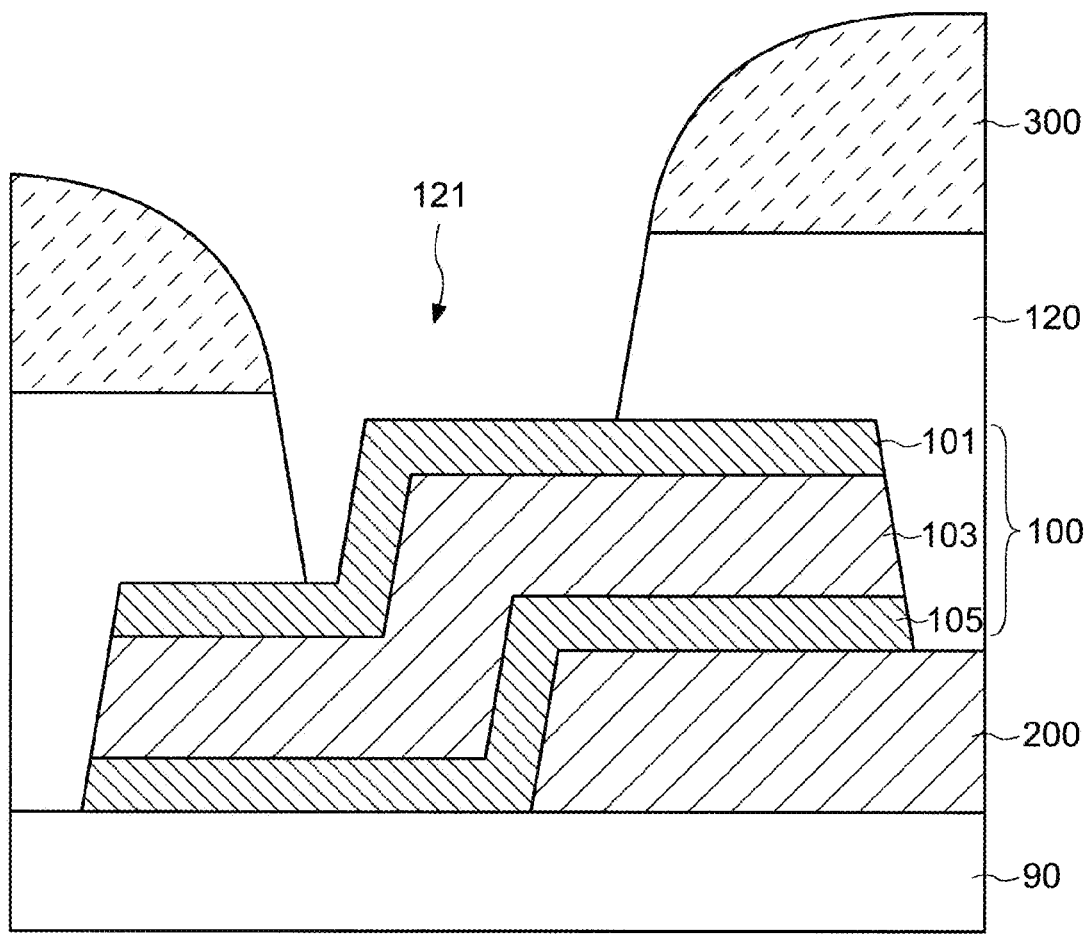
FIG. 3 is a cross-sectional diagram showing a manufacturing method of a wiring structure related to one embodiment of the present invention.
Figure 4:
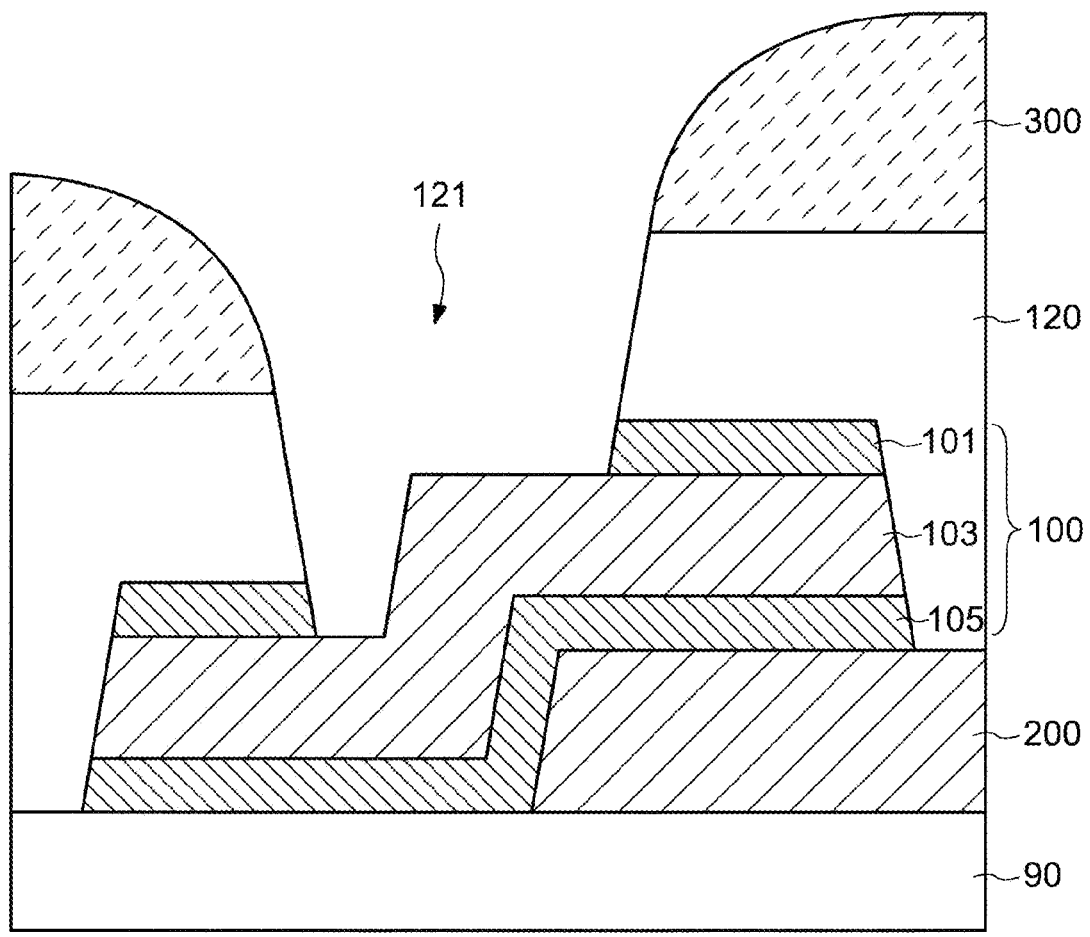
FIG. 4 is a cross-sectional diagram showing a manufacturing method of a wiring structure related to one embodiment of the present invention.
Figure 5:
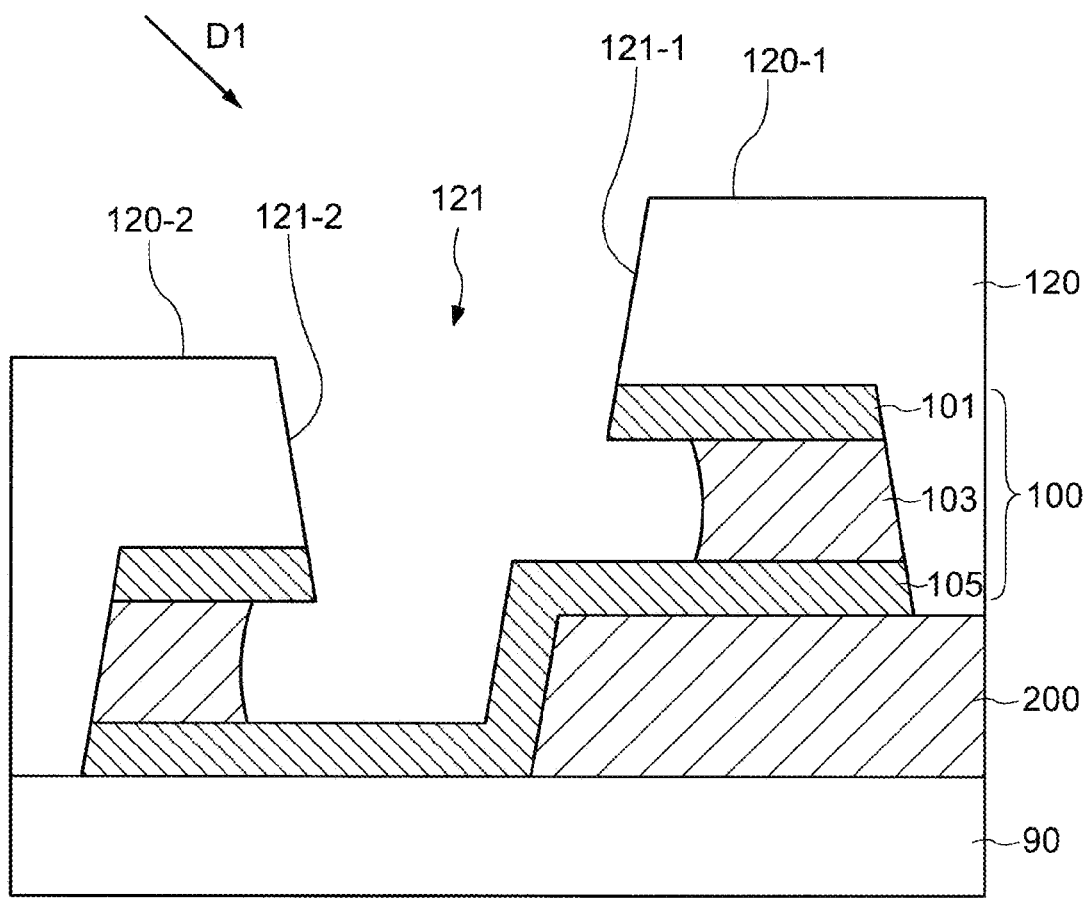
FIG. 5 is a cross-sectional diagram showing a manufacturing method of a wiring structure related to one embodiment of the present invention.

A manufacturing method of the wiring structure 10 according to one embodiment of the present invention is explained using FIG. 3 to FIG. 5. FIG. 3 to FIG. 5 are cross-sectional diagrams showing a manufacturing method of a wiring structure according to one embodiment of the present invention.

As is shown in FIG. 3, the first insulating layer 120 is etched using a photoresist 300 in which a region corresponding to the first opening 121 is opened, in a state in which the structure body 200, the first conductive layer 100 and the first insulating layer 120 are formed above the base layer 90. A condition in which the etching rate of the first insulating layer 120 is higher than the etching rate of the first conductive layer 100 (particularly, the first film 101) is used as an etching condition. The state shown in FIG. 3 is a state in which the etching of the first insulating layer 120 is stopped at the first film 101. That is, the first film 101 has a function as an etching stopper when etching the first insulating layer 120.

In the case when only the first insulating layer 120 is etched, the etching time is determined based on the etching rate and the film thickness of the first insulating layer 120. As a result, it is possible to stop etching of the first insulating layer 120 before the first film 101 disappears. However, in the case when the in-plane variation of the film thickness of the first insulating layer 120 is large, or in the case when other insulating layers arranged further below the first insulating layer 120 are etched in the etching process of the first insulating layer 120, then the first film 101 may be etched and the second film 103 may be exposed as is shown in FIG. 4.

In the case when the process proceeds in a state where the second film 103 exposed in the first opening 121 as is shown in FIG. 4, the second film 103 which is exposed on the surface is cleaned by using a chemical solution such as hydrofluoric acid (HF) or the like an exposed to a chemical treatment process. As a result, as is shown in FIG. 5, the second film 103 may also be etched. In the case when the second film 103 is etched in the cleaning process or the chemical treatment process, the second film 103 is isotropically etched. Therefore, the second film 103 is side-etched in a horizontal direction further than the end part of the first film 101. As a result, a part of the surface of the first film 101 on the second film 103 side is exposed, and a space is formed corresponding to the gap 150 in FIG. 1.

In the case when a pattern edge part 201 of the structure body 200 does not exist in a region which overlaps the first opening 121 in a plane view and below the first opening 121, when the second conductive layer 130 is formed in a state in which the second film 103 is side-etched in a horizontal direction further than the end part of the first film 101, the second conductive layer 130 is disconnected, and a stable connection between the second conductive layer 130 and the first conductive layer 100 cannot be ensured.

However, in the case of the structure shown in FIG. 5, the upper surface 120-2 of the first insulating layer 120 in a region where the structure body 200 is not arranged is closer to the base layer 90 than the upper surface 120-1 of the first insulating layer 120 in a region where the structure body 200 is arranged. As a result, the material of the second conductive layer 130 which has come from the upper surface 120-2 side (that is, has flown in the direction D1) is easy to form in a region where the upper surface 120-1 of the side wall 121-1 side and the region below the side wall 121-1. As a result, as is shown in FIG. 1, it is possible to continuously form the second conductive layer 130 from the side wall 121-1 to the third film 105.

Modified Example of First Embodiment

Figure 6:
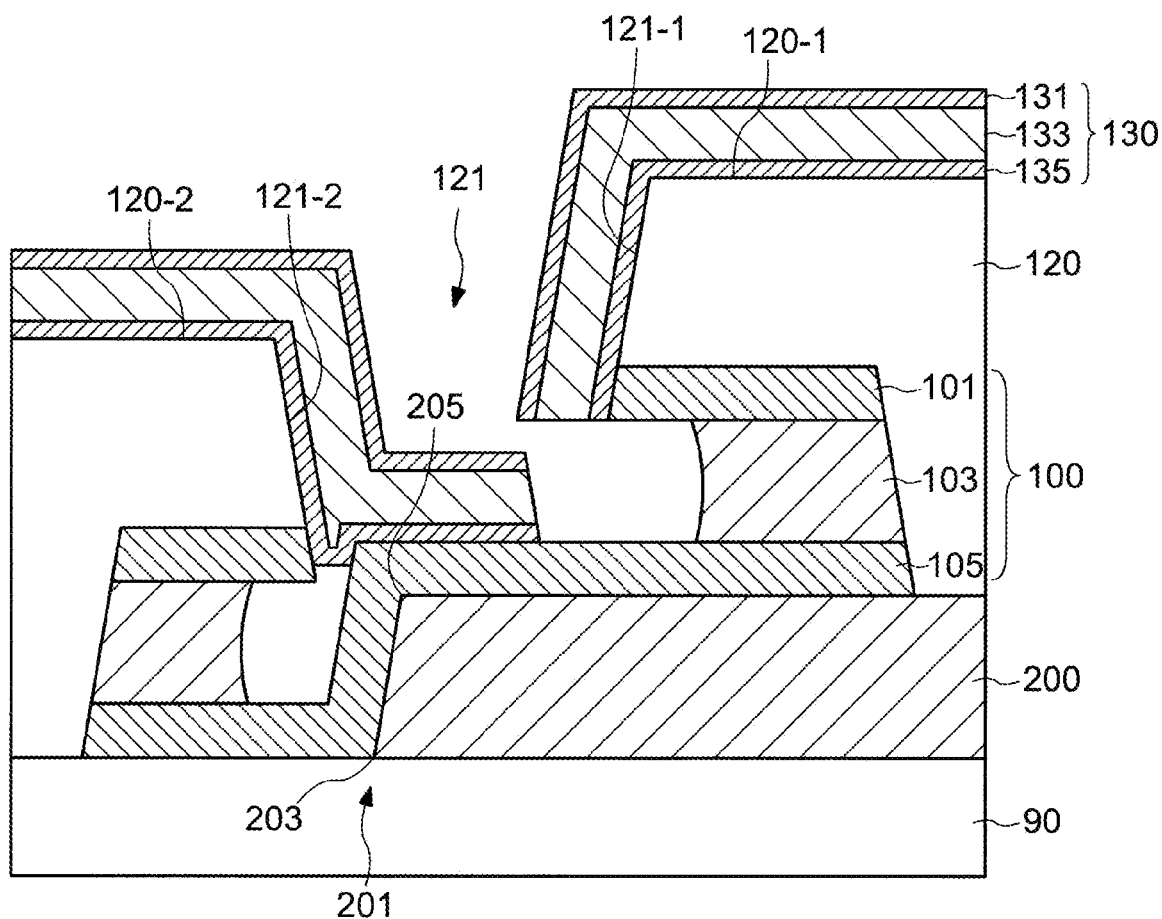
FIG. 6 is a cross-sectional diagram showing a summary of a wiring structure related to one embodiment of the present invention.

The wiring structure 10 according to a modified example of the first embodiment is explained using FIG. 6. FIG. 6 is a cross-sectional diagram showing a summary of a wiring structure according to one embodiment of the present invention.

Figure 7:
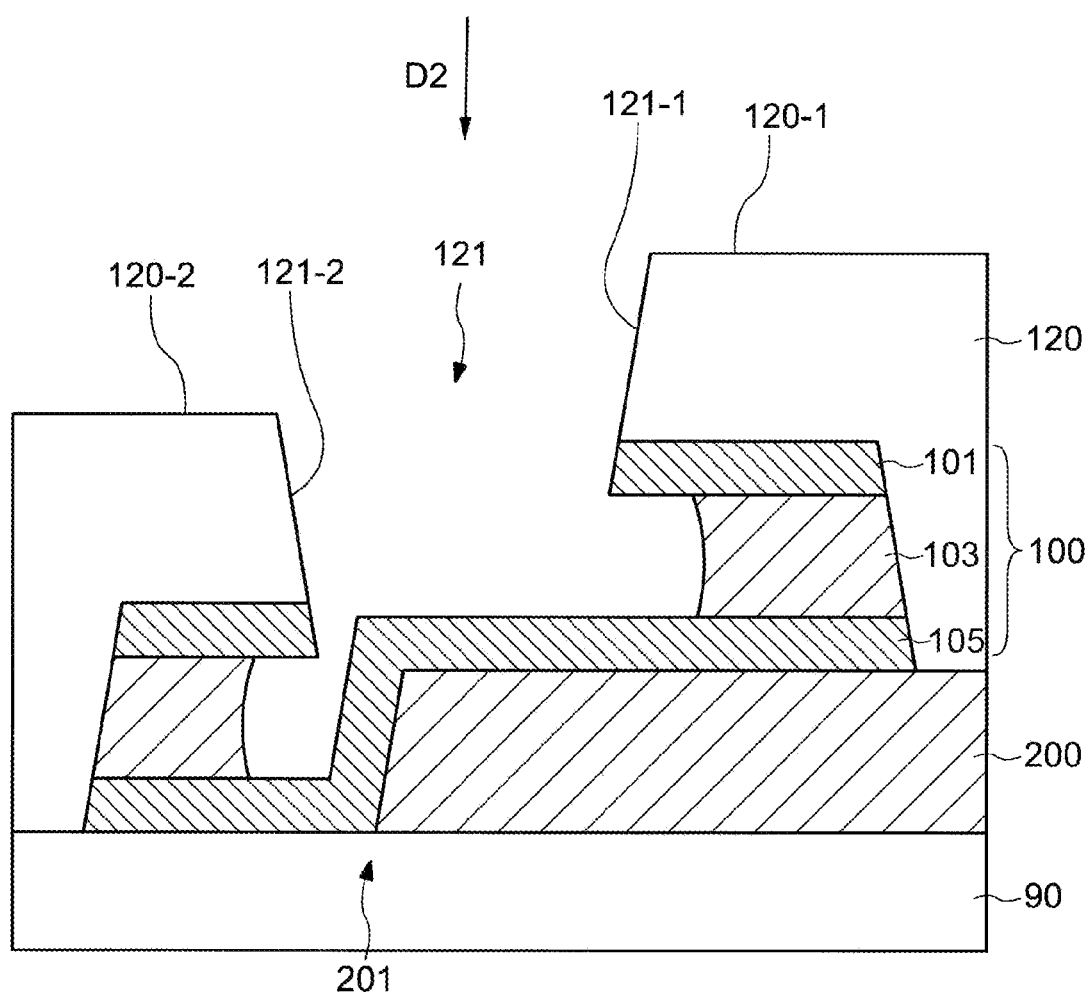
FIG. 7 is a cross-sectional diagram showing a manufacturing method of a wiring structure related to one embodiment of the present invention.

In the wiring structure 10 shown in FIG. 6, the pattern edge part 201 of the structure body 200 is located closer to the side wall 121-2 than the side wall 121-1 compared with the wiring structure 10 shown in FIG. 1. In addition, unlike FIG. 1, the second conductive layer 130 is continuous from the side wall 121-2 to the third film 105. The wiring structure 10 shown in FIG. 6 is obtained by forming the second conductive layer 130 on the structure in the state shown in FIG. 7. In the case of the structure shown in FIG. 7, the third film 105 arranged on the upper surface of the structure body 200 in the vicinity of the pattern edge part 201 of the structure body 200 is positioned in the vicinity of the side wall 121-2. As a result, the material of the second conductive layer 130 flying from above (that is, flying in the direction D2) is formed on the side wall 121-2 and formed on the third film 105 in the vicinity of the pattern edge part 201. Here, since the distance between the side wall 121-2 and the pattern edge part 201 is short, the second conductive layer 130 is formed to be continuous from the side wall 121-2 to the third film 105 as shown in FIG. 6.

Although FIG. 6 exemplifies a structure in which all of the films of the first film 131, the second film 133 and the third film 135 included in the second conductive layer 130 are continuous from the side wall 121-2 to the third film 105, the present embodiment is not limited to this structure. For example, any one of the plurality of films included in the second conductive layer 130 may be continuous from the side wall 121-2 to the third film 105, and all of the plurality of films do not need to be continuous.

As described above, in the case when the pattern edge part 201 of the structure body 200 is positioned closer to the side wall 121-1 than the side wall 121-2, it adopts the shape as shown in FIG. 1, and in the case when it is located closer to the side wall 121-2 than the side wall 121-1, it adopts the shape as shown in FIG. 6. Therefore, even when there is misalignment of the pattern between the structure body 200 and the first opening 121, it is possible to ensure stable conduction between the first conductive layer 100 and the second conductive layer 130.

It is preferred that the bottom part 203 and the upper part 205 of the pattern edge part 201 of the structure body 200 both exist at a position which overlaps the first opening 121 in a plane view. Here, the upper part 205 of the pattern edge part 201 can be defined as a position having the smallest curved radius between the side wall of the pattern edge part 201 and the upper surface of the structure body 200. The maximum value of the inclination angle of the side wall at the pattern edge part 201 of the structure body 200 is preferred to be 30° or more or 60° or more. The thickness of the structure body 200 is preferred to be 10 nm or more or 50 nm or more.

A ratio which shows the "opening diameter:opening depth" of the first opening 121 is preferred to be 2:1 or more and 50:1 or less. An aspect ratio of the first opening 121 can be calculated based on, for example, the opening diameter of the first opening 121 in a plane view and the thickness of the first insulating layer 120 from the upper surface 120-1 to the first conductive layer 100 vertically below. In the case when the opening diameter of the first opening 121 is a circle shape in a plane view of the first opening 121, it can be defined as the diameter of the circle, and in the case when the shape in a plane view of the first opening 121 is a shape other than a circle, it can be defined as the length of a position having the longest distance in the shape

Second Embodiment

A wiring structure and a manufacturing method of a wiring structure related to one embodiment of the present invention is explained using FIG. 8 to FIG. 13. The wiring structure of the embodiments shown herein may also use an integrated circuit (IC) such as a micro-processing unit (MPU) or a memory circuit in addition to a semiconductor device such as a transistor used in a display device.

Structure of Wiring Structure 10

Figure 8:
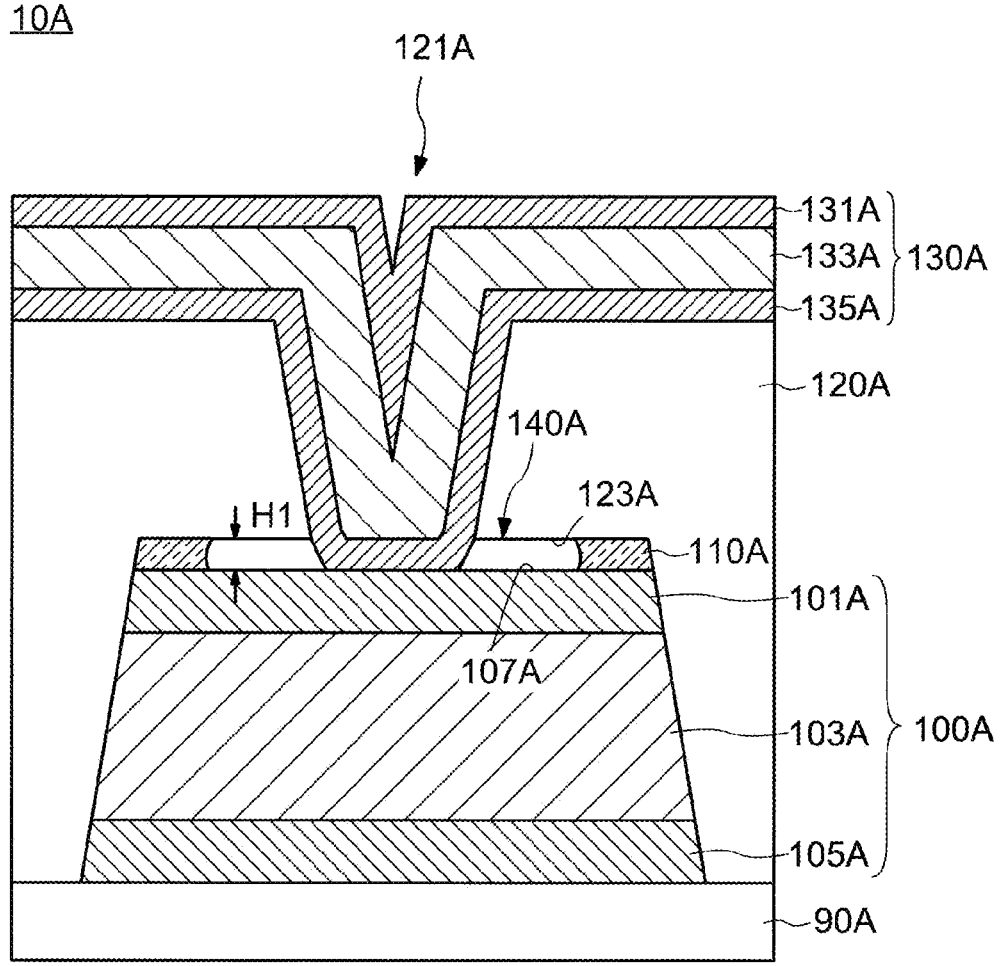
FIG. 8 is a cross-sectional diagram showing a summary of a wiring structure related to one embodiment of the present invention.
Figure 9:
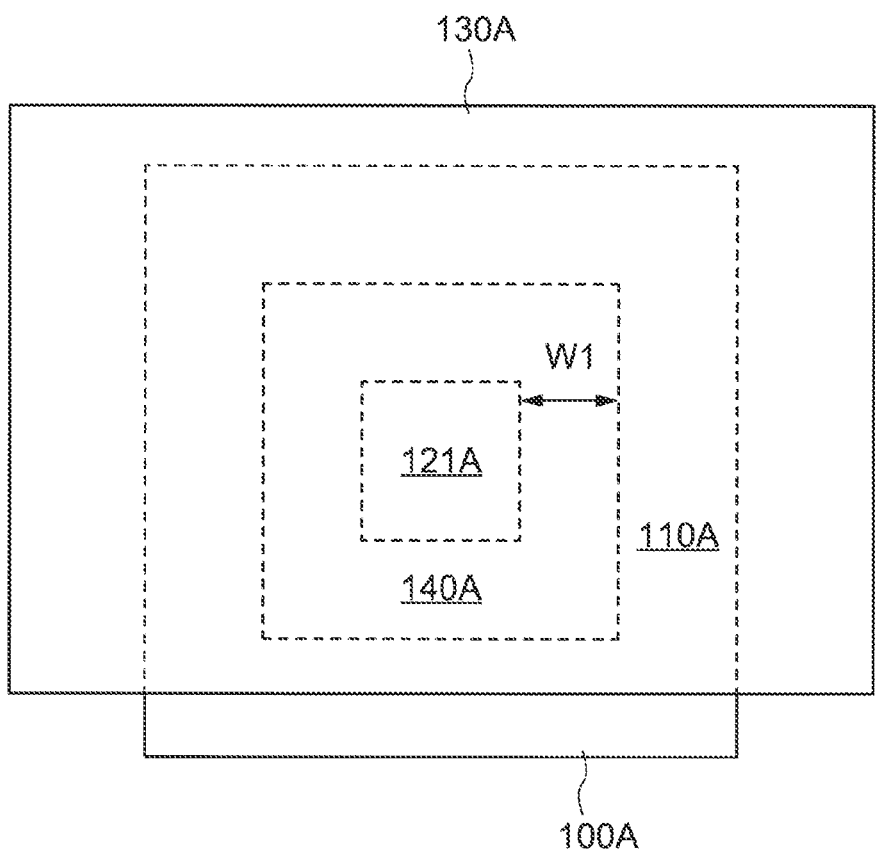
FIG. 9 is a plane view diagram showing a summary of a wiring structure related to one embodiment of the present invention.

The structure of the wiring structure 10A according to one embodiment of the present invention is explained using FIG. 8 and FIG. 9. FIG. 8 is a cross-sectional view showing a summary of a wiring structure according to one embodiment of the present invention. FIG. 9 is a plane view showing a summary of a wiring structure according to one embodiment of the present invention.

As is shown in FIG. 8, the wiring structure 10A is arranged above the base layer 90A. The wiring structure 10A includes a first conductive layer 100A, a second oxide semiconductor layer 110A, a first insulating layer 120A and a second conductive layer 130A. The first conductive layer 100A is arranged above the base layer 90A. The second oxide semiconductor layer 110A is arranged above the first conductive layer 100A. The first insulating layer 120A is arranged above the base layer 90A, the first conductive layer 100A and the second oxide semiconductor layer 110A. A first opening 121A is arranged in the first insulating layer 120A. The first opening 121A overlaps the first conductive layer 100A in a plane view. The second conductive layer 130A is arranged above the first insulating layer 120A and inside the first opening 121A, and is in contact with the first conductive layer 100A at the bottom part or below the first opening 121A.

A gap 140A which is surrounded by the second oxide semiconductor layer 110A is arranged between the first conductive layer 100A and the first insulating layer 120A. That is, the first conductive layer 100A is separated from the first insulating layer 120A in a region where the gap 140A is arranged. The gap 140A is surrounded by the first conductive layer 100A, the second oxide semiconductor layer 110A, the first insulating layer 120A and the second conductive layer 130A. In other words, a part of the first surface 123A which faces the first conductive layer 100A, that is, a part of the first surface 123A on the first conductive layer 100A side of the first insulating layer 120A is exposed from the second conductive layer 130A to the second oxide semiconductor layer 110A in the gap 140A. A part of the second surface 107A of the first conductive layer 100A facing the first surface 123A is exposed in the gap 140A from the second conductive layer 130A to the second oxide semiconductor layer 110A. Although described in detail herein, a region in which the gap 140A is arranged is a region in which the second oxide semiconductor layer 110A is arranged on the way of the manufacturing process, and corresponds to a region where the second oxide semiconductor layer 110A is removed in a certain step.

As is shown in FIG. 9, the gap 140A is arranged in the periphery of the first opening 121A in a plane view. When combined with the cross-sectional structure shown in FIG. 8, it can be said that the region where the first conductive layer 100A and the second conductive layer 130A are in contact at the bottom of the first opening 121A is continuously surrounded by the gap 140A. In other words, the gap 140A has an annular shape (ring shape or closed loop shape). The gap 140A is continuously surrounded by the second oxide semiconductor layer 110A. In other words, the second oxide semiconductor layer 110A has an annular shape.

The width W1 (see FIG. 9) of the gap 140A is larger than the height H1 (see FIG. 8) of the gap 140A. Furthermore, the width W1 is the distance from the second conductive layer 130A at the bottom part of the first opening 121A to the second oxide semiconductor layer 110A which surrounds the gap 140A. The height H1 is a distance from the first surface 123A to the second surface 107A. The ratio of the height H1 to the width W1 (that is, H1/W1) is preferred to be 0.0025 or more or 0.3 or more.

The composition ratio of oxygen of the second oxide semiconductor layer 110A is smaller than the composition ratio oxygen in the stoichiometric ratio with respect to an oxide semiconductor having the same composition as the second oxide semiconductor layer 110A. In other words, an oxide semiconductor in which oxygen is deficient is used as the second oxide semiconductor layer 110A. In other words, the composition ratio of oxygen of the second oxide semiconductor layer 110A is smaller than the composition ratio of oxygen of the first oxide semiconductor layer (oxide semiconductor layer used as the channel of the transistor). However, the composition ratio of oxygen of the second oxide semiconductor layer 110A may be the same as or larger than the composition ratio of oxygen in the stoichiometric ratio with respect to the oxide semiconductor having the same composition as the second oxide semiconductor layer 110A. In addition, the composition ratio of oxygen of the second oxide semiconductor layer 110A may be the same as or larger than the composition ratio of oxygen of the first oxide semiconductor layer.

In the case when the first insulating layer 120A is an oxide insulating layer, the composition ratio of oxygen of the first insulating layer 120A is larger than the composition of oxygen ratio in the stoichiometric ratio with respect to the oxide having the same composition as the first insulating layer 120A. That is, an oxide containing an excess amount of oxygen is used as the first insulating layer 120A. In other words, the composition ratio of oxygen of the first insulating layer 120A is larger than the composition ratio of oxygen of the oxide having the same composition as that of the first insulating layer 120A used in the other layers. However, the composition ratio of oxygen of the first insulating layer 120A may be the same as or smaller than the composition ratio of oxygen in the stoichiometric ratio with respect to the oxide having the same composition as the first insulating layer 120A. The composition ratio of oxygen of first insulating layer 120A may be the same as or smaller than the composition ratio of oxygen of an oxide having the same composition as the first insulating layer 120A used in the other layers.

The first conductive layer 100A includes a first film 101A, a second film 103A and a third film 105A. The first film 101A is in contact with the second oxide semiconductor layer 110A vertically below the second oxide semiconductor layer 110A. The first film 101A is in contact with the third film 135A of the second conductive layer 130A described herein. The second film 103A is arranged below the first film 101A. The third film 105A is arranged below the second film 103A.

In the present embodiment, although a structure was exemplified in which three films are stacked as the first conductive layer 100A and the second conductive layer 130A, the present invention is not limited to this structure. For example, each of the first conductive layer 100A and the second conductive layer 130A may have a stacked layer structure in which four or more films are stacked, a stacked structure in which two films are stacked or a single layer structure formed by one film.

Effects of the Structure According to Second Embodiment

Figure 10A:
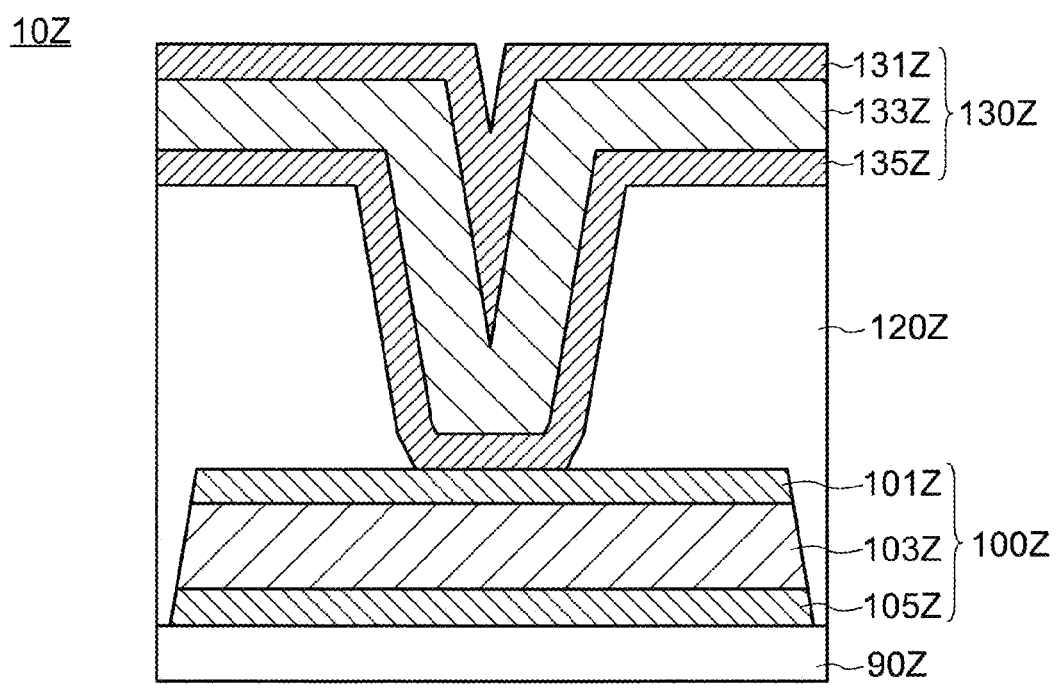
FIG. 10A is a cross-sectional diagram for explaining a problem point in a conventional wiring structure.
Figure 10B:
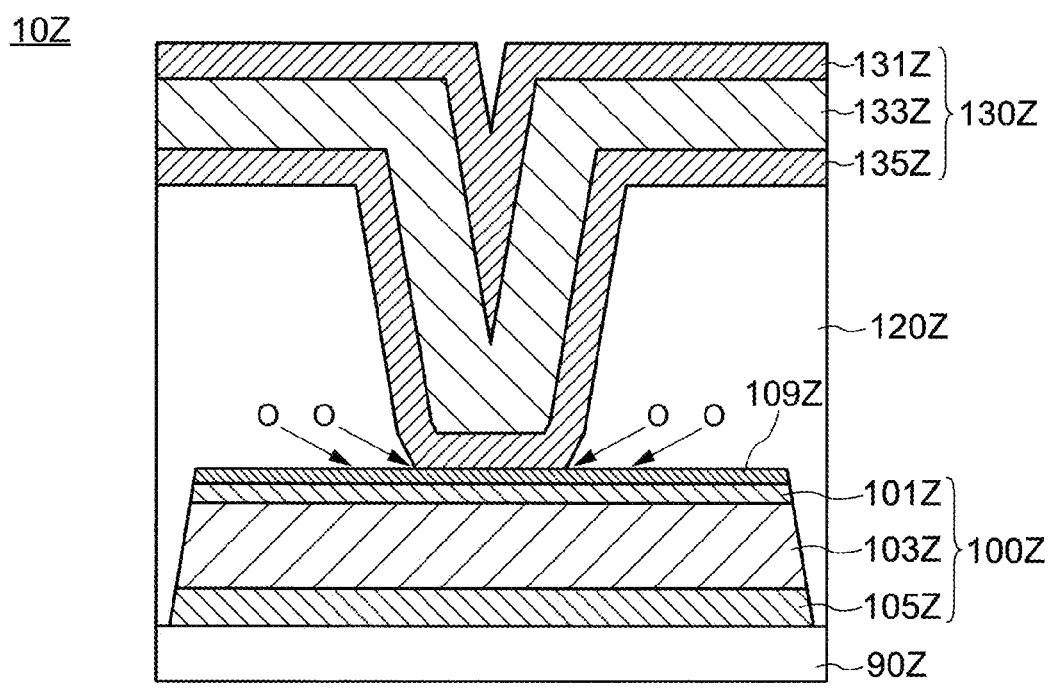
FIG. 10B is a cross-sectional diagram for explaining a problem point in a conventional wiring structure.
Figure 11:
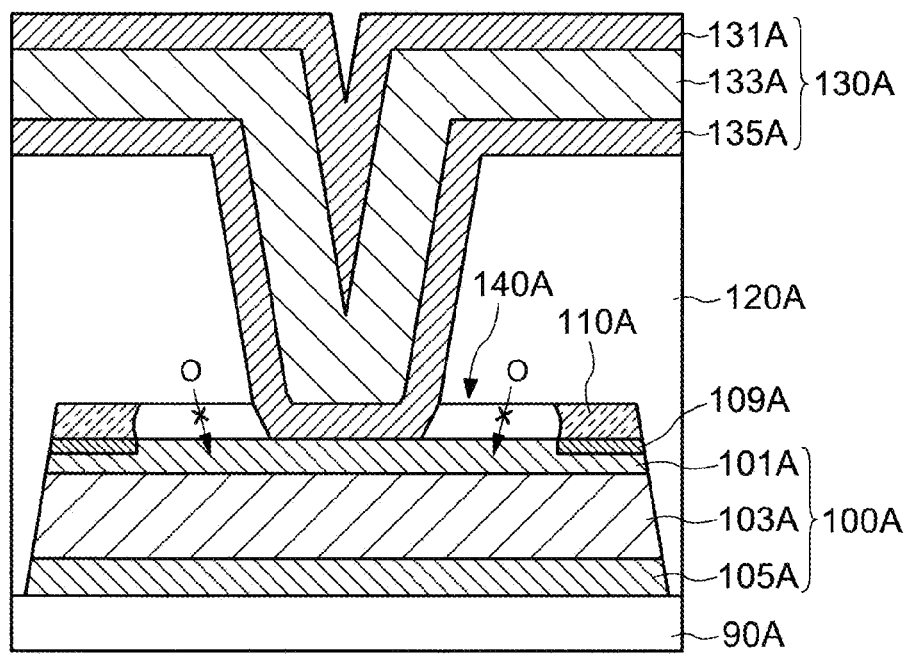
FIG. 11 is a cross-sectional diagram for explaining an effect by the wiring structure related to one embodiment of the present invention.

FIG. 10A and FIG. 10B explain problems newly found by the inventors in the process leading to the present invention. The effects obtained by the structure related to the second embodiment of the present invention are explained using FIG. 11. FIG. 10A and FIG. 10B are cross-sectional diagrams explaining the problems in a conventional wiring structure. FIG. 11 is a cross-sectional diagram for explaining the effects of the wiring structure according to one embodiment of the present invention. In the wiring structure 10Z shown in FIG. 10A and FIG. 10B and the wiring structure 10A shown in FIG. 11, a structure is exemplified in which an oxide insulating layer is used as first insulating layers 120Z and 120A. The structures of the first conductive layer 100Z and the second conductive layer 130Z are the same as the structures of the first conductive layer 100A and the second conductive layer 130A shown in FIG. 8.

In the case when an oxide insulating layer is used as the first insulating layers 120Z and 120A, the physical properties of the oxide insulating layer are different depending on the structure of the device applied with the wiring structures 10Z and 10A. For example, in the case of a structure where the wiring structures 10Z and 10A are applied to a transistor and an oxide semiconductor layer is used as a channel of the transistor and the oxide insulating layer covers the oxide semiconductor layer, an oxide insulating layer having a higher oxygen ratio than the oxygen ratio in the stoichiometric ratio of the oxide layer material is used as the oxide insulating layer. This oxide insulating layer with a high oxygen ratio discharges oxygen to the exterior of the oxide insulating layer by performing a heat treatment. That is, oxygen included in the oxide insulating layer is diffused into another layer adjacent to the oxide insulating layer when a heat treatment is performed.

Although the wiring structure 10Z shown in FIG. 10A is similar to the wiring structure 10A shown in FIG. 8, it is different to the wiring structure 10A in that the oxide semiconductor layer (110A) and the gap (140A) are not arranged above the first conductive layer 100Z. When a heat treatment is performed in the state shown in FIG. 10A, the contact resistance may increase between the first conductive layer 100Z and the second conductive layer 130Z. It is assumed that the following phenomenon is the cause.

FIG. 10B shows the behavior of oxygen in the first insulating layer 120Z in a state where the heat treatment is performed, and a change in the upper surface of the first film 101Z due to the oxygen. When a heat treatment is performed in the state shown in FIG. 10A, oxygen in the first insulating layer 120Z diffuses into the first conductive layer 100Z, and a part of the first conductive layer 100Z is oxidized. FIG. 10B exemplifies a structure in which the first film 101Z included in the first conductive layer 100Z is oxidized, and a metal oxide layer 109Z is formed on the upper surface of the first film 101Z. The metal oxide layer 109Z is formed not only on the upper surface of the first film 101Z in contact with the first insulating layer 120Z, but is also formed on the upper surface of the first film 101Z which is in contact with the third film 135Z of the second conductive layer 130Z in FIG. 10A. This is because oxygen is diffused from the first insulating layer 120Z to the interface between the first film 101Z and the third film 135Z, and the metal oxide layer 109Z is also formed on the upper surface of the first film 101Z which is in contact with the third film 135Z.

As described above, when the metal oxide layer 109Z is formed between the first conductive layer 100Z and the second conductive layer 130Z, the contact resistance the two increases.

Although FIG. 10B exemplifies a structure in which the metal oxide layer 109Z is formed only on the upper surface of the first film 101Z, the metal oxide layer 109Z may also be formed on the lower surface of the third film 135Z. Although FIG. 10B exemplifies an example in which the metal oxide layer 109Z is formed on the entire region where the first film 101Z and the third film 135Z are in contact with each other in FIG. 10A, the region where the metal oxide layer 109Z is formed may also be a part of the region where both are in contact.

As is shown in FIG. 11, in the wiring structure 10A, since the gap 140A is arranged in the vicinity of the contact region between the first film 101A and the third film 135A, the first insulating layer 120A does not contact the first film 101A and the third film 135A in the vicinity of the contact region described above. As a result, oxygen which has diffused from the first insulating layer 120A cannot reach the first film 101A and the third film 135A in the vicinity of the contact region described above. As a result, as is shown in FIG. 10B, it is possible to suppress the formation of the metal oxide layer 109Z between the first conductive layer 100Z and the second conductive layer 130Z.

Manufacturing Method of Wiring Structure 10A

Figure 12:
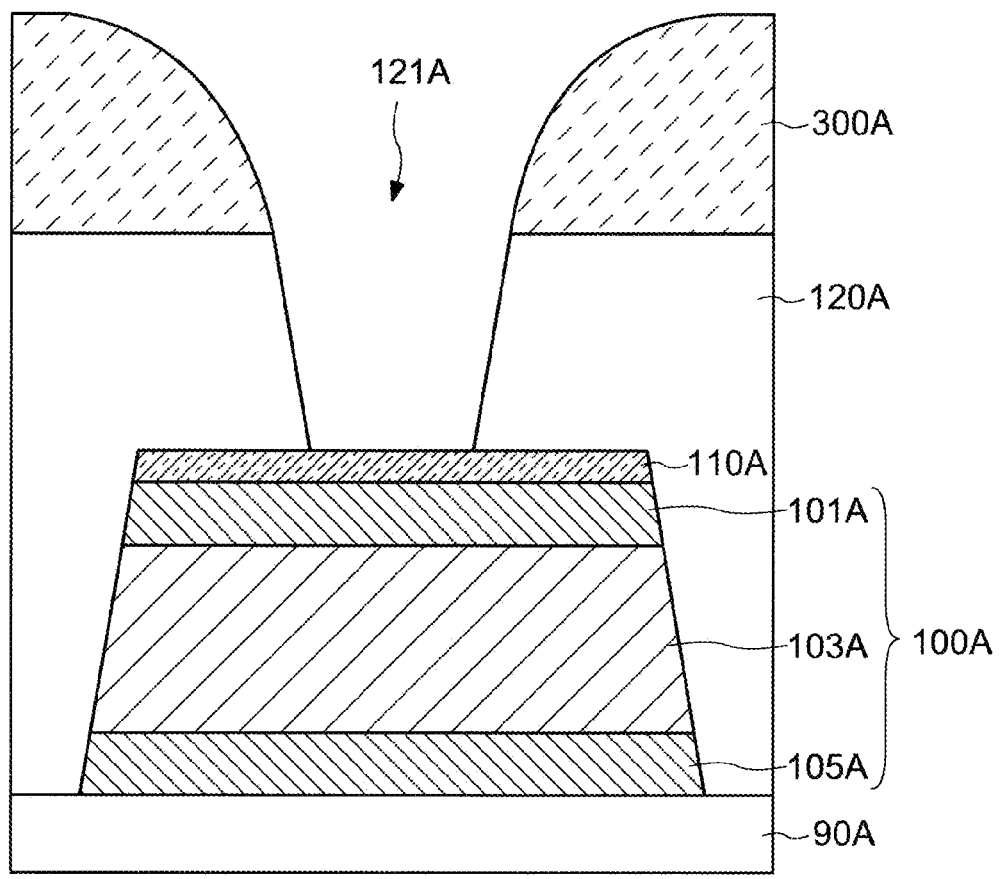
FIG. 12 is a cross-sectional diagram showing a manufacturing method of a wiring structure related to one embodiment of the present invention.
Figure 13:
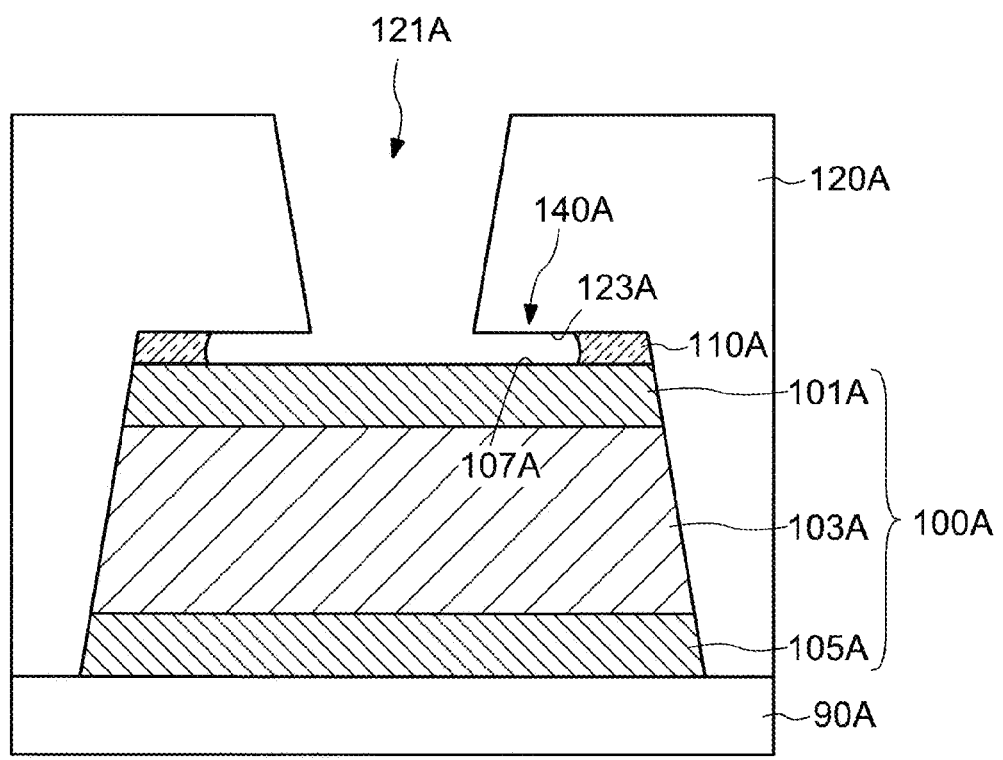
FIG. 13 is a cross-sectional diagram showing a manufacturing method of a wiring structure related to one embodiment of the present invention.

A manufacturing method of the wiring structure 10A according to one embodiment of the present invention is explained using FIG. 12 and FIG. 13. FIG. 12 and FIG. 13 are cross-sectional diagrams showing a manufacturing method of a wiring structure according to one embodiment of the present invention.

As is shown in FIG. 12, the first insulating layer 120A is etched using the photo resist 300A in which an opening is formed corresponding to the first opening 121A in a state where the first conductive layer 100A, the second oxide semiconductor layer 110A, and the first insulating layer 120A are formed above the base layer 90A. A condition in which the etching rate of the first insulating layer 120A is higher than the etching rate of the second oxide semiconductor layer 110A is used as an etching condition. The state of FIG. 12 is a state in which etching of the first insulating layer 120A is stopped at the second oxide semiconductor layer 110A. That is, the second oxide semiconductor layer 110A has the function of an etching stopper when etching the first insulating layer 120A.

In the case when the first insulating layer 120A is etched by dry etching, the oxide semiconductor layer is hardly etched under dry etching conditions which generally etch the insulating layer. In particular, in the case when silicon oxide and silicon nitride are used as the first insulating layer 120A, and an oxide semiconductor (referred to herein as IGZO)

including In, Ga, Zn, and O is used as the second oxide semiconductor layer 110A, IGZO is hardly etched under the dry etching conditions for etching silicon oxide. Therefore, in the case when there is a large in-plane variation in the film thickness of the first insulating layer 120A, or even in the case where another insulating layer arranged below the first insulating layer 120A is etched in the etching process of the first insulating layer 120A, dry etching is stopped at the second oxide semiconductor layer 110A in the region where the first opening 121A is formed.

As is shown in FIG. 12, the second oxide semiconductor layer 110A is wet-etched with high etching rate conditions compared to the etching rate of the first insulating layer 120A such as hydrofluoric acid (HF) for example in a state where the surface of the second oxide semiconductor layer 110A is exposed. The second oxide semiconductor layer 110A which is wet-etched is side-etched in a horizontal direction further than the end part of the first insulating layer 120A at the bottom part of the first opening 121A. As a result, as is shown in FIG. 13, a part of the first surface 123A of the first insulating layer 120A, the first surface 123A is a surface facing the first conductive layer 100A, is exposed, and a space corresponding to the gap 140 in FIG. 8 is formed. By forming the second conductive layer 130A on the structure shown in FIG. 13, it is possible to form the wiring structure 10A shown in FIG. 8.

Third Embodiment

A semiconductor device (transistor), a display device using the semiconductor device, and a manufacturing method of the display device according to one embodiment of the present invention is explained using FIG. 14 to FIG. 21. Furthermore, in the embodiments described below, a structure in which the wiring structure explained in the first embodiment and the second embodiment is applied to a transistor which forms a circuit of a liquid crystal display device is explained.

Summary of Display Device 20B

Figure 14:
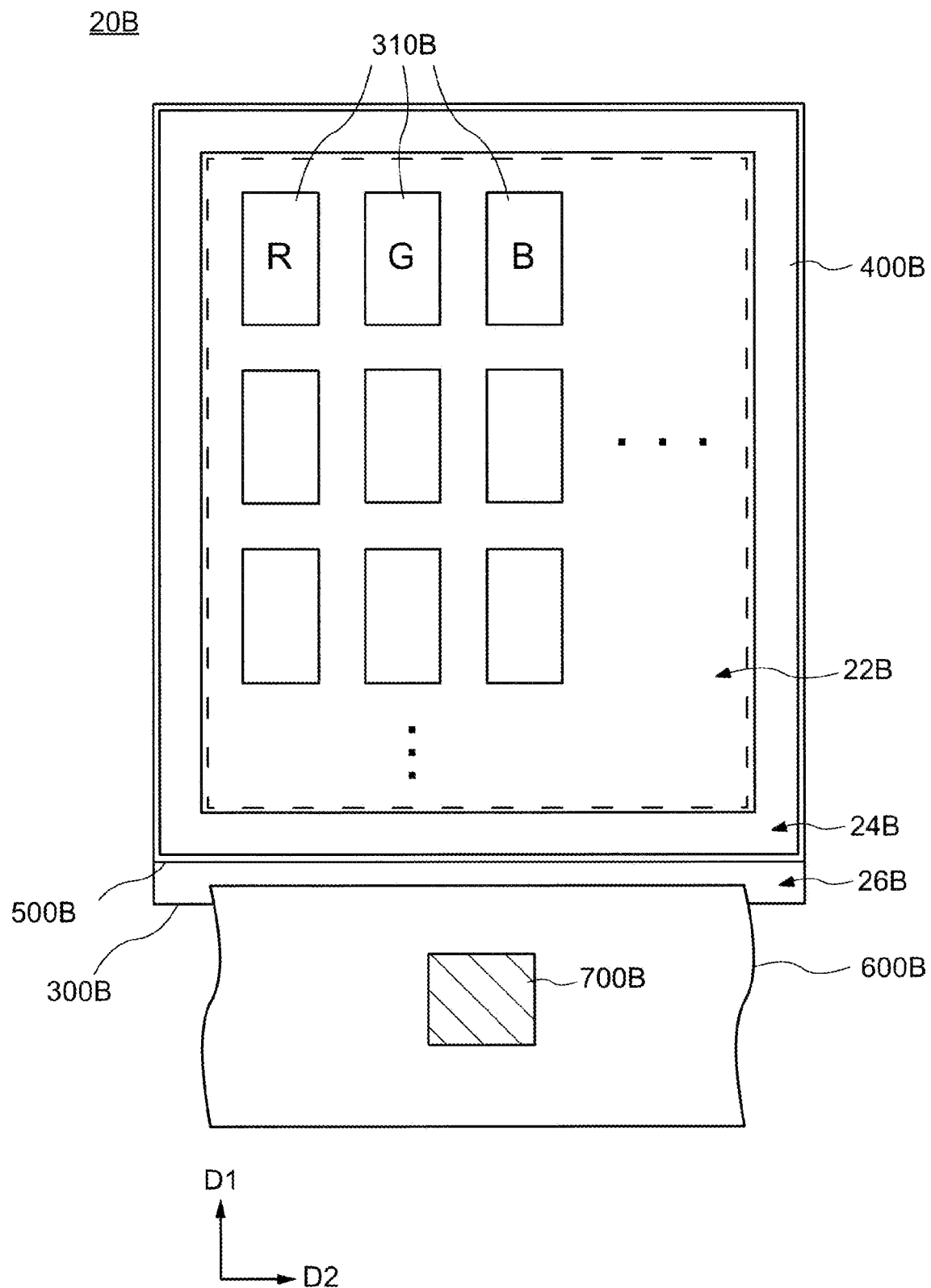
FIG. 14 is a plane view diagram showing a summary of a display device related to one embodiment of the present invention.

FIG. 14 is a plane view showing a summary of a display device according to one embodiment of the present invention. As is shown in FIG. 14, the display device 20B includes an array substrate 300B, a seal part 400B, a counter substrate 500B, a flexible printed circuit substrate 600B (FPC 600B) and an IC chip 700B. The array substrate 300B and the counter substrate 500B are bonded together by the seal part 400B. A plurality of pixel circuits 310B are arranged in a matrix in a liquid crystal region 22B which is surrounded by the seal part 400B. The liquid crystal region 22B is a region which overlaps a liquid crystal element 410B described herein in a plane view.

A seal region 24B which overlaps the seal part 400B in a plane view is a region in the periphery of the liquid crystal region 22B. The FPC 600B is arranged in a terminal region 26B. The terminal region 26B is a region where the array substrate 300B is exposed from the counter substrate 500B, and is arranged on the outer side of the seal region 24B. Furthermore, the outer side of the seal region 24B means the outer side of the region surrounded by the seal part 400B. The IC chip 700B is arranged above the FPC 600B. The IC chip 700B supplies a signal for driving each pixel circuit 310B.

Circuit Structure of Display Device 20B

Figure 15:
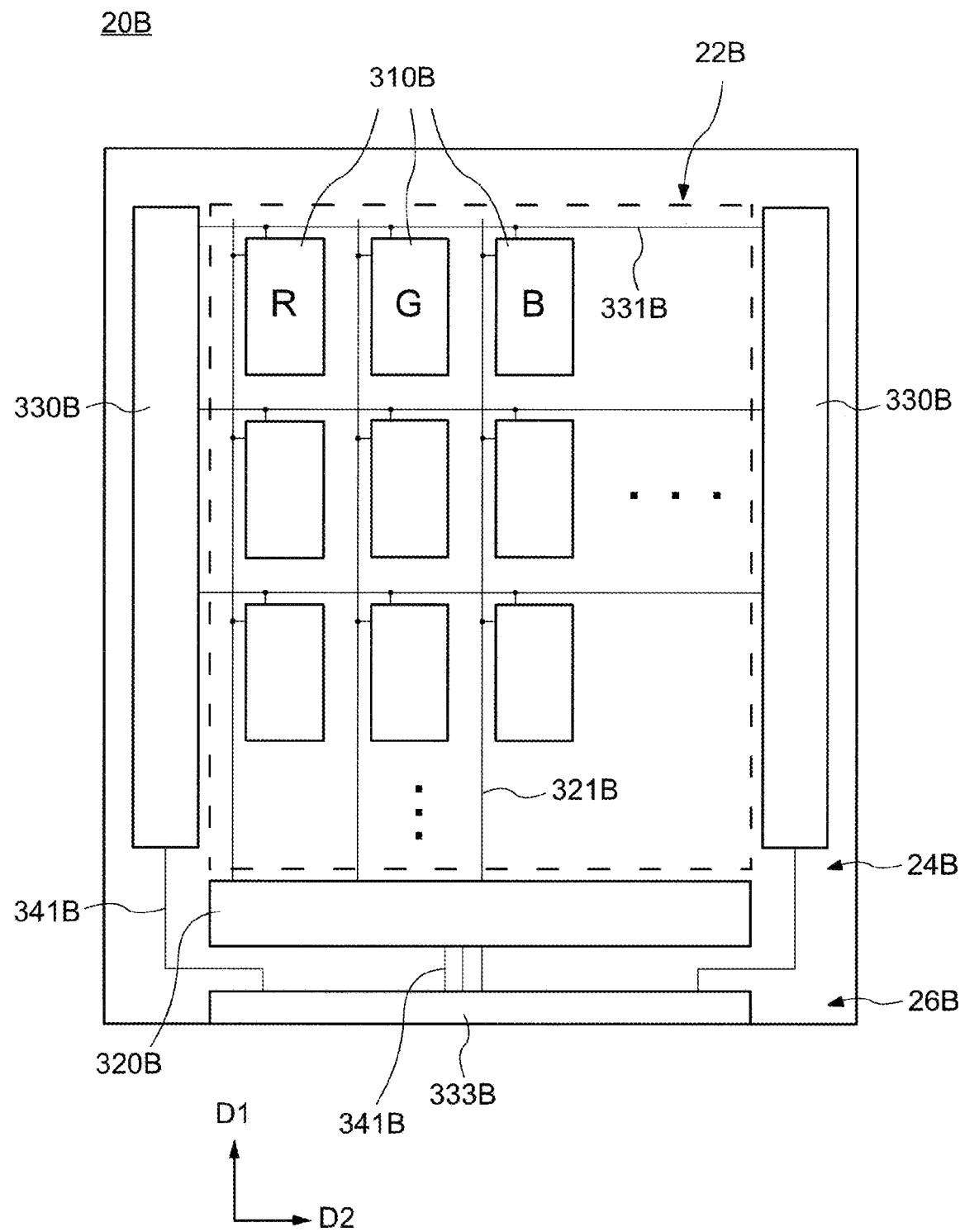
FIG. 15 is a block diagram showing a circuit structure of a display device related to one embodiment of the present invention.

FIG. 15 is a block diagram showing a circuit structure of a display device according to one embodiment of the present invention. As is shown in FIG. 15, a source driver circuit 320B is arranged at a position adjacent in the D1 direction (column direction) of the liquid crystal region 22B where the pixel circuit 310B is arranged, and a gate driver circuit 330B is arranged at a position adjacent in the D2 direction (row direction) of the liquid crystal region 22B. The source driver circuit 320B and the gate driver circuit 330B are arranged in the seal region 24B described above.

A source wiring 321B extends from the source driver circuit 320B in the D1 direction and is connected to a plurality of pixel circuits 310B arranged in the D1 direction. A gate wiring 331B extends from the gate driver circuit 330B in the D2 direction and is connected to a plurality of pixel circuits 310B arranged in the D2 direction.

A terminal part 333B is arranged in the terminal region 26B. The terminal part 333B and the source driver circuit 320B are connected by a connection wiring 341B. Similarly, the terminal part 333B and the gate driver circuit 330B are connected by a connection wiring 341B. By connecting the FPC 600B to the terminal part 333B, an external device which is connected to the FPC 600B and the display device 20B are connected, and a signal from the external device drives each pixel circuit 310B arranged in the display device 20B.

The wiring structures shown in the first embodiment and the second embodiment are applied to the source wiring 321B, the gate wiring 331B and the connection wiring 341B. In addition, the wiring structures shown in the first and second embodiments are applied to wirings and transistors included in the pixel circuit 310B, the source driver circuit 320B and the gate driver circuit 330B.

Pixel Circuit 310B of Display Device 20B

Figure 16:
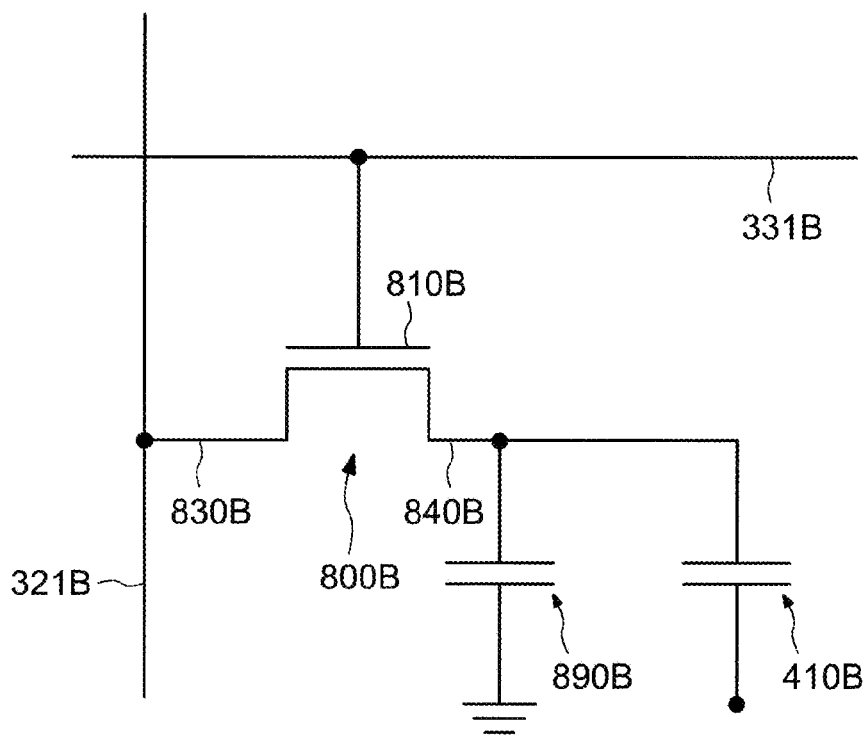
FIG. 16 is a circuit diagram showing a pixel circuit of a display device related to one embodiment of the present invention.

FIG. 16 is a circuit diagram showing a pixel circuit of a display device according to one embodiment of the present invention. As is shown in FIG. 16, the pixel circuit 310B includes elements such as a transistor 800B, a storage capacitor 890B and a liquid crystal element 410B. The transistor 800B includes a gate electrode 810B, a source electrode 830B and a drain electrode 840B. The gate electrode 810B is connected to the gate wiring 331B. The source electrode 830B is connected to the source wiring 321B. The drain electrode 840B is connected to the storage capacitor 890B and the liquid crystal element 410B. The wiring structure shown in the first embodiment and the second embodiment is applied to each wiring and transistor shown in FIG. 16. Furthermore, although 830B is referred to as a source electrode and 840B is referred to as a drain electrode in the present embodiment for the convenience of explanation, the function as the source and the function as the drain of each electrode may be interchanged.

Cross-Sectional Structure of Display Device 20B

Figure 17:
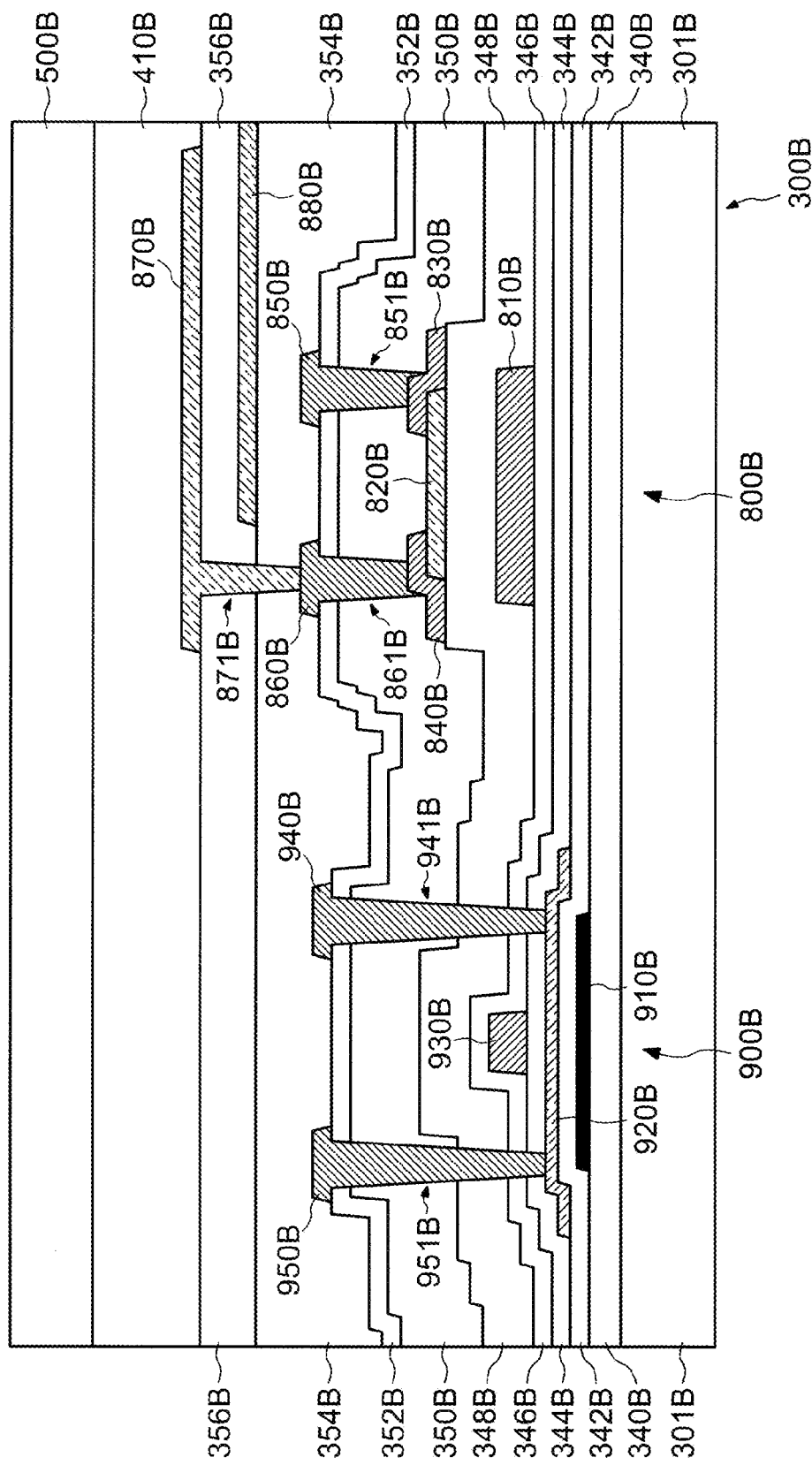
FIG. 17 is a cross-sectional diagram showing a display device related to one embodiment of the present invention.

FIG. 17 is a cross-sectional diagram of a display device according to one embodiment of the present invention. As is shown in FIG. 17, the display device 20B is a display device in which transistors 800B and 900B which have different structures are arranged above the same substrate. The structure of the transistor 800B is different from the structure of the transistor 900B. Specifically, the transistor 800B is a bottom-gate type transistor in which the first oxide semiconductor layer 820B is used as a channel. The transistor 900B is a top-gate type transistor in which the semiconductor layer 920B is used as a channel. For example, the transistor 800B is used for the pixel circuit 310B, and the transistor 900B is used for the source driver circuit 320B and the gate driver circuit 330B. Furthermore, the transistor 900B may be used for the pixel circuit 310B.

The transistor 800B is a transistor formed above the substrate 301B, and the insulating layers 340B, 342B, 344B and 346B are used as base layers. A gate electrode 810B is arranged above the insulating layer 346B. A first oxide semiconductor layer 820B is arranged above the gate electrode 810B. The gate electrode 810B is opposed to the first oxide semiconductor layer 820B. An insulating layer 348B which functions as a gate insulating layer is arranged between the gate electrode 810B and the first oxide semiconductor layer 820B. A source electrode 830B is arranged at one end part of a pattern of the first oxide semiconductor layer 820B, and a drain electrode 840B is arranged at the other end part of a pattern of the first oxide semiconductor layer 820B. The source electrode 830B and the drain electrode 840B are connected to the first oxide semiconductor layer 820B on the top surface and side surface of the first oxide semiconductor layer 820B respectively.

The insulating layers 350B and 352B are arranged above the first oxide semiconductor layer 820B, the source electrode 830B and the drain electrode 840B. Openings 851B and 861B are arranged in the insulating layers 350B and 352B. A source wiring 850B is arranged above the insulating layer 352B and inside the opening 851B. A drain wiring 860B is arranged above the insulating layer 352B and inside the opening 861B.

An insulating layer 354B is arranged above the source wiring 850B and the drain wiring 860B. A common electrode 880B which is arranged in common for a plurality of pixels is arranged above the insulating layer 354B. An insulating layer 356B is arranged above the common electrode 880B. An opening 871B is arranged in the insulating layers 354B and 356B. A pixel electrode 870B is arranged above the insulating layer 356B and inside the opening 871B.

Figure 18:
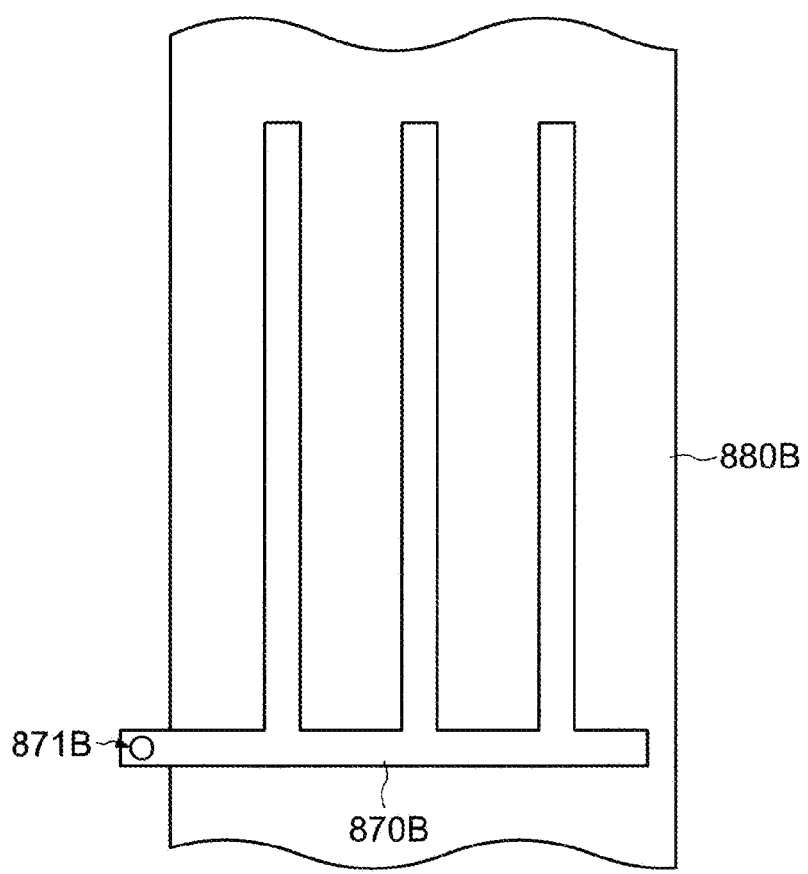
FIG. 18 is a plane view diagram showing a pixel electrode and a common electrode of a display device related to one embodiment of the present invention.

FIG. 18 is a plane view of a pixel electrode and a common electrode of a display device according to one embodiment of the present invention. As is shown in FIG. 18, the common electrode 880B has an overlapping region which overlaps with the pixel electrode 870B in a plane view, and a non-overlapping region which does not overlap with the pixel electrode 870B. When a voltage is supplied between the pixel electrode 870B and the common electrode 880B, a horizontal electric field is formed from the pixel electrode 870B toward the common electrode 880B in the non-overlapping region. The gradation of the pixel is determined by the operation of liquid crystal molecules which are included in the liquid crystal element 410B by the horizontal electric field.

In the structure described above, the wiring structure 10 in FIG. 1 or FIG. 6 can be applied as a contact structure between the source electrode 830B and the source wiring 850B and as a contact structure between the drain electrode 840B and the drain wiring 860B. In this case, the structure body 200 corresponds to the first oxide semiconductor layer 820B. The first conductive layer 100 corresponds to the source electrode 830B or the drain electrode 840B. The first insulating layer 120 corresponds to the insulating layers 350B and 352B. The first opening 121 corresponds to the opening 851B or the opening 861B. The second conductive layer 130 corresponds to the source wiring 850B or the drain wiring 860B.

Furthermore, in the case when the first conductive layer 100 corresponds to the source electrode 830B, the drain electrode 840B may be referred to as a "third conductive layer". In this case, it can be said that the first oxide semiconductor layer 820B is arranged between the first conductive layer (source electrode 830B) and the third conductive layer (drain electrode 840B). The insulating layers 354B and 356B above the source wiring 850B and the drain wiring 860B may be referred to as a "third insulating layer". The opening 871B may be referred to as a "fourth opening".

The transistor 900B is a transistor which is formed in the substrate 301B, and the insulating layer 340B is used as a base layer. A light shielding layer 910B is arranged above the insulating layer 340B. An insulating layer 342B is provided over the light shielding layer 910B. A semiconductor layer 920B is arranged above the insulating layer 342B. A gate electrode 930B is arranged above the semiconductor layer 920B. An insulating layer 344B which functions as a gate insulating layer is arranged between the semiconductor layer 920B and the gate electrode 930B. Insulating layers 346B, 348B, 350B and 352B are arranged above the gate electrode 930B. Openings 941B and 951B are arranged in these insulating layers. A source wiring 940B is arranged above the insulating layer 352B and inside the opening 941B. A drain wiring 950B is arranged above the insulating layer 352B and inside the opening 951B. An insulating layer 354B is arranged above the source wiring 940B and the drain wiring 950B.

Here, at least one of the insulating layers 344B, 346B, and 348B which is an insulating layer arranged further below the first oxide semiconductor layer 820B and at least one insulating layer which is arranged further above the semiconductor layer 920B may be referred to as a "second insulating layer". In this case, it can be said that the second insulating layer is arranged below the first oxide semiconductor layer 820B which corresponds to the structure body 200 in FIG. 1. It can be said that the semiconductor layer 920B is arranged below the second insulating layer and is arranged in a region which does not overlap with the openings 851B and 861B which correspond to the first opening 121 in FIG. 1 in a plane view. In addition, among the openings 941B and 951B, an opening which is arranged in a region of the insulating layers 350B and 352B which correspond to the first insulating layer 120 in FIG. 1 may be referred to as a second opening. Among the openings 941B and 951B, the opening which is arranged in a region of the second insulating layer described above may be referred to as a third opening. In this case, it can be said that the second opening and the third opening are each arranged in a region which overlaps the semiconductor layer 920B in a plane view.

It is possible to use an oxide insulating layer as the insulating layer 350B. The composition ratio of oxygen in the oxide insulating layer may be larger than the composition ratio of oxygen in a stoichiometric ratio with respect to an oxide having the same composition as the oxide insulating layer. In other words, the composition ratio of oxygen of the insulating layer 350B may be larger than the composition ratio of oxygen of the oxide insulating layer which is used as another insulating layer shown in FIG. 17. For example, the composition ratio of oxygen of the insulating layer 350B may be larger than the composition ratio of oxygen of the oxide in the case where the insulating layer 348B which functions as a gate insulating layer contains an oxide Manufacturing Method of Display Device 20B The manufacturing method of the display device 20B is explained using FIG. 19 and FIG. 20. Since the manufacturing method of the transistors 800B and 900B uses a general bottom-gate type transistor and a top-gate type transistor, an explanation is omitted here. A method for forming an opening in an insulating layer is explained in FIG. 19 and FIG. 20.

Figure 19:
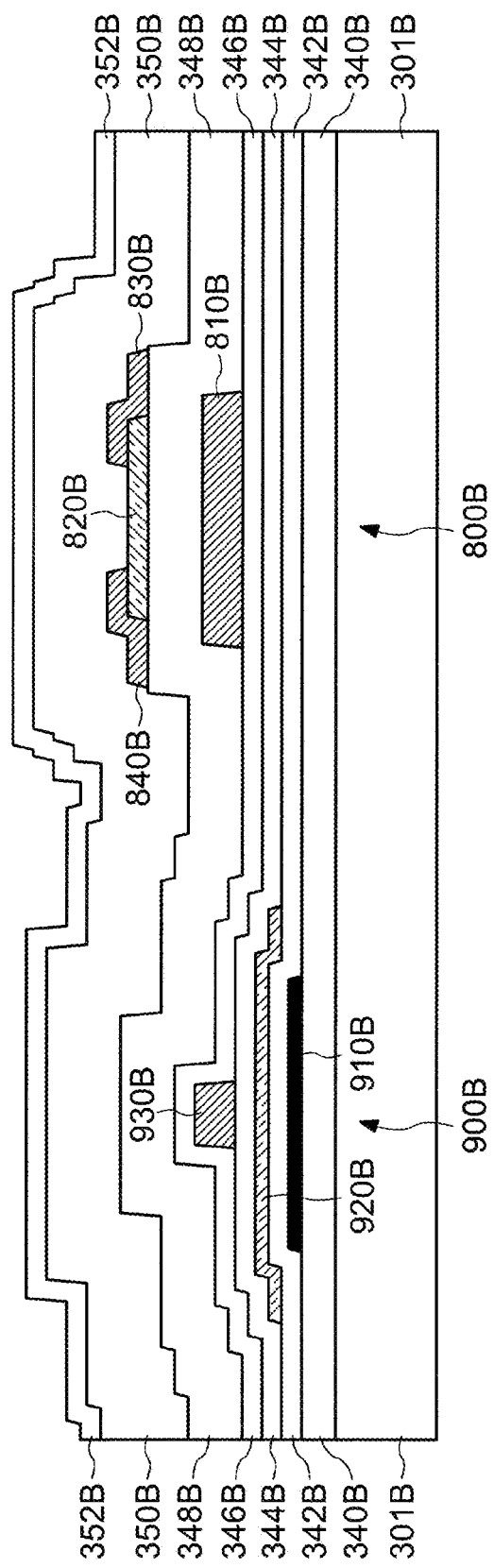
FIG. 19 is a cross-sectional diagram showing a manufacturing method of a display device related to one embodiment of the present invention.

FIG. 19 is a diagram showing a state immediately before the openings 851B, 861B, 941B and 951B are formed in the insulating layers 350B and 352B. A resist mask in which regions corresponding to the openings 851B, 861B, 941B, and 951B are opened is formed above the insulating layer 352B in the state shown in FIG. 19. Next, openings 851B, 861B, 941B and 951B are formed reaching the source electrode 830B, the drain electrode 840B or the semiconductor layer 920B. These openings are formed by dry etching.

Figure 20:
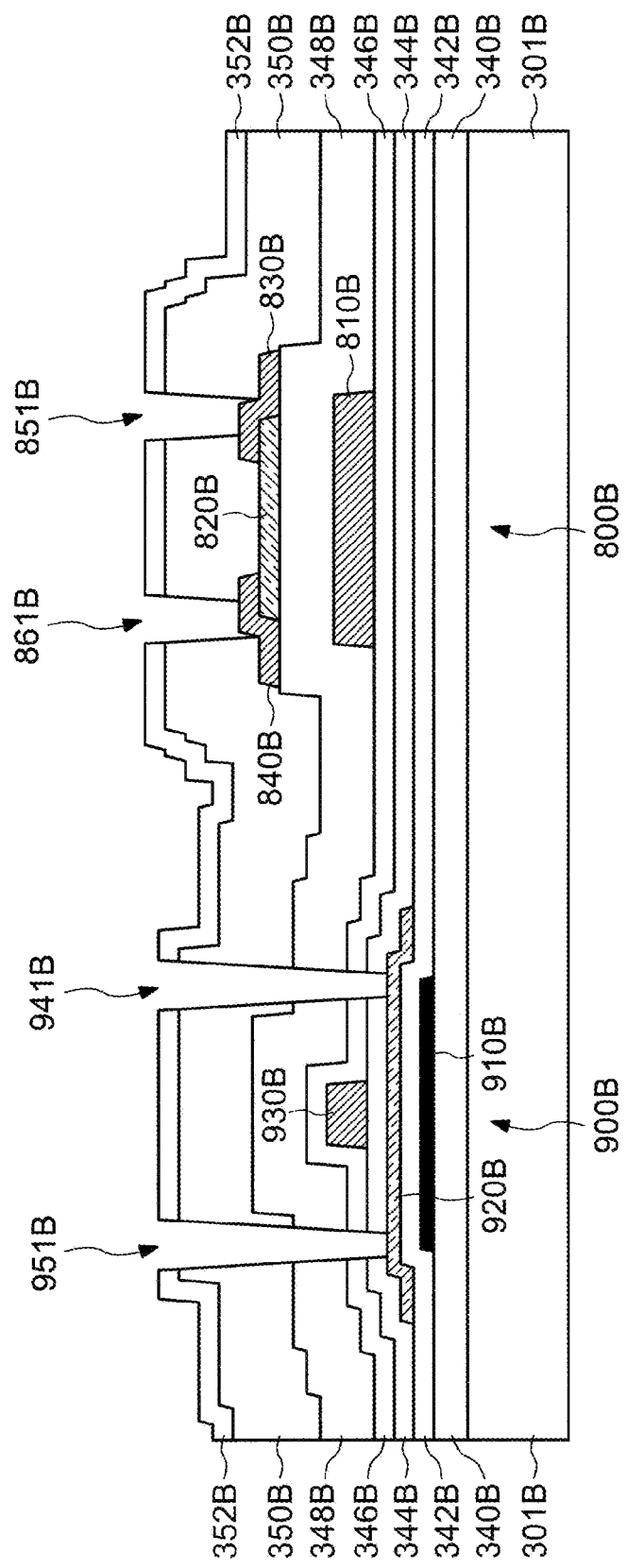
FIG. 20 is a cross-sectional diagram showing a manufacturing method of a display device related to one embodiment of the present invention.

As is shown in FIGS. 19 and 20, the number of stacked insulating layers arranged above the semiconductor layer 920B is larger than the number of stacked insulating layers arranged above the source electrode 830B and the drain electrode 840B. Therefore, when attempting to open the openings 851B, 861B, 941B, and 951B during the same process, the openings 851B and 861B first reach the source electrode 830B and the drain electrode 840B, and in this state the openings 941B and 951B are continuously formed. As a result, the source electrode 830B and the drain electrode 840B are continuously etched until the openings 941B and 951B reach the semiconductor layer 920B. The shapes of the source electrode 830B and the drain electrode 840B in the state shown in FIG. 20 is the shape shown in FIG. 4.

As is shown in FIG. 20, a chemical treatment using, for example, HF is performed in order to remove an oxide film which is formed on the surface of the semiconductor layer 920B exposed by the openings 941B and 951B. The shape of the source electrode 830B and the drain electrode 840B becomes the shape shown in FIG. 5 by performing this chemical treatment. A conductive layer is formed above the insulating layer 352B and inside the openings 851B, 861B, 941B and 951B shown in FIG. 20 and are patterned to form source wirings 850B and 940B and drain wirings 860B and 950B. The transistors 800B and 900B are formed by the manufacturing method described above.

Modified Example of Third Embodiment

Figure 21:
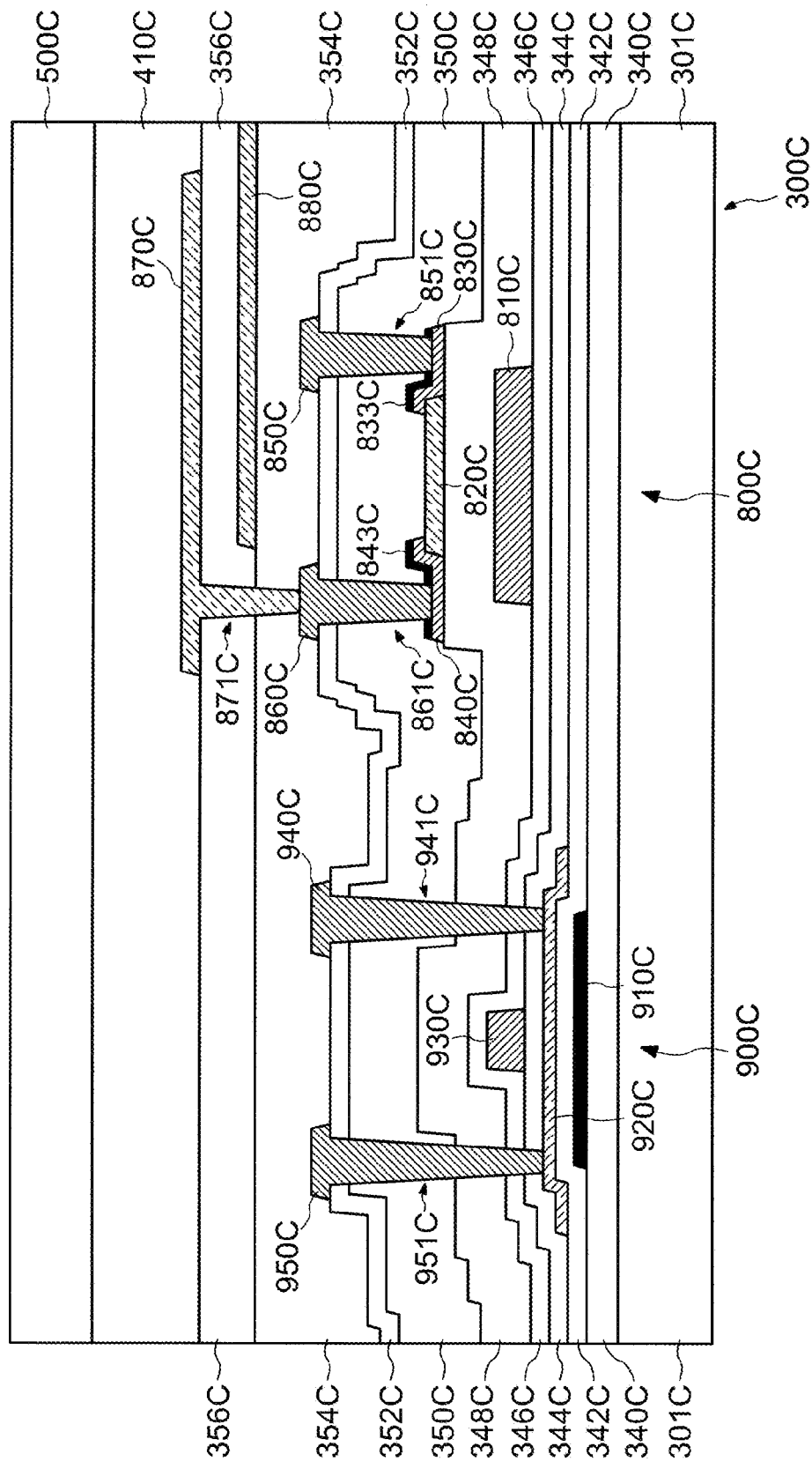
FIG. 21 is a cross-sectional diagram showing a display device related to one embodiment of the present invention.

A display device 20C according to a modified example of the third embodiment is explained using FIG. 21. FIG. 21 is a cross-sectional view showing a summary of a display device according to one embodiment of the present invention. Although the display device 20C shown in FIG. 21 is similar to the display device 20B shown in FIG. 17, they are different in structure whereby the structure of the transistor 800C included in the display device 20C is different to the structure of the transistor 800B included in the display device 20B. In the structure of the display device 20C shown in FIG. 21 herein, an explanation of the same structure as the display device 20B shown in FIG. 17 is be omitted, and differences from the display device 20B are explained.

As is shown in FIG. 21, the wiring structure 10A shown in FIG. 8 is used as the contact structure between the source electrode 830C and the source wiring 850C, and the contact structure between the drain electrode 840C and the drain wiring 860C. In addition, the second oxide semiconductor layers 833C and 843C are arranged above the source electrode 830C and the drain electrode 840C respectively.

When FIG. 8 and FIG. 21 are compared, the first conductive layer 100A corresponds to the source electrode 830C or the drain electrode 840C, the second oxide semiconductor layer 110A corresponds to the second oxide semiconductor layer 833C or 843C, the insulating layer 120A corresponds to the insulating layers 350C and 352C, the first opening 121A corresponds to the opening 851C or the opening 861C, and the second conductive layer 130A corresponds to the source wiring 850C or the drain wiring 860C.

Here, at least one of the insulating layers 344C, 346C, and 348C which is an insulating layer arranged further below the first oxide semiconductor layer 820C and at least one insulating layer which is arranged further above the semiconductor layer 920C may be referred to as a "second insulating layer". In this case, it can be said that the second insulating layer is arranged below the source electrode 830C and the drain electrode 840C which correspond to the first conductive layer 100A in FIG. 8. It can be said that the semiconductor layer 920C is arranged below the second insulating layer and is arranged in a region which does not overlap the openings 851C and 861C which correspond to the first opening 121A in FIG. 8. In addition, among the openings 941C and 951C, the opening which is arranged in the region of the insulating layers 350C and 352C which corresponds to the first insulating layer 120A in FIG. 8 may be referred to as a "second opening". Among the openings 941C and 951C, the opening which is arranged in the region of the second insulating layer may be referred to as a "third opening". In this case, it can be said that the second opening and the third opening are each arranged in a region which overlaps the semiconductor layer 920C in a plane view.

The composition ratio of oxygen in the second oxide semiconductor layers 833C and 843C is smaller than the composition ratio of oxygen in the stoichiometric ratio with respect to an oxide semiconductor having the same composition as these oxide semiconductor layers. In other words, the composition ratio of oxygen of the second oxide semiconductor layers 833A and 843C is smaller than the composition ratio of oxygen of the first oxide semiconductor layer 820C.

It is possible to use an oxide insulating layer as the insulating layer 350C. The composition ratio of oxygen in the oxide insulating layer may be larger than the composition ratio of oxygen in a stoichiometric ratio with respect to an oxide having the same composition as the oxide insulating layer. In other words, the composition ratio of oxygen of the insulating layer 350C may be larger than the composition ratio of oxygen of the oxide insulating layer which is used as another insulating layer shown in FIG. 21. For example, the composition ratio of oxygen of the insulating layer 350C may be larger than the composition ratio of oxygen of the oxide in the case where the insulating layer 348C which functions as the gate insulating layer includes an oxide.

In the manufacturing method of the display device 20C shown in FIG. 21, the process for forming the openings 851C, 861C, 941C and 951C is performed using the same manufacturing method as in FIG. 19 and FIG. 20. At this time, as is shown in FIG. 12, the second oxide semiconductor layers 833C and 843C function as etching stoppers for the openings 851C and 861C. In addition, side etching of the second oxide semiconductor layers 833C and 843C as shown in FIG. 13 is performed by a chemical treatment which removes an oxide film formed on the surface of the semiconductor layer 920C which is exposed by the openings 941C and 951C.

Fourth Embodiment

Figure 22:
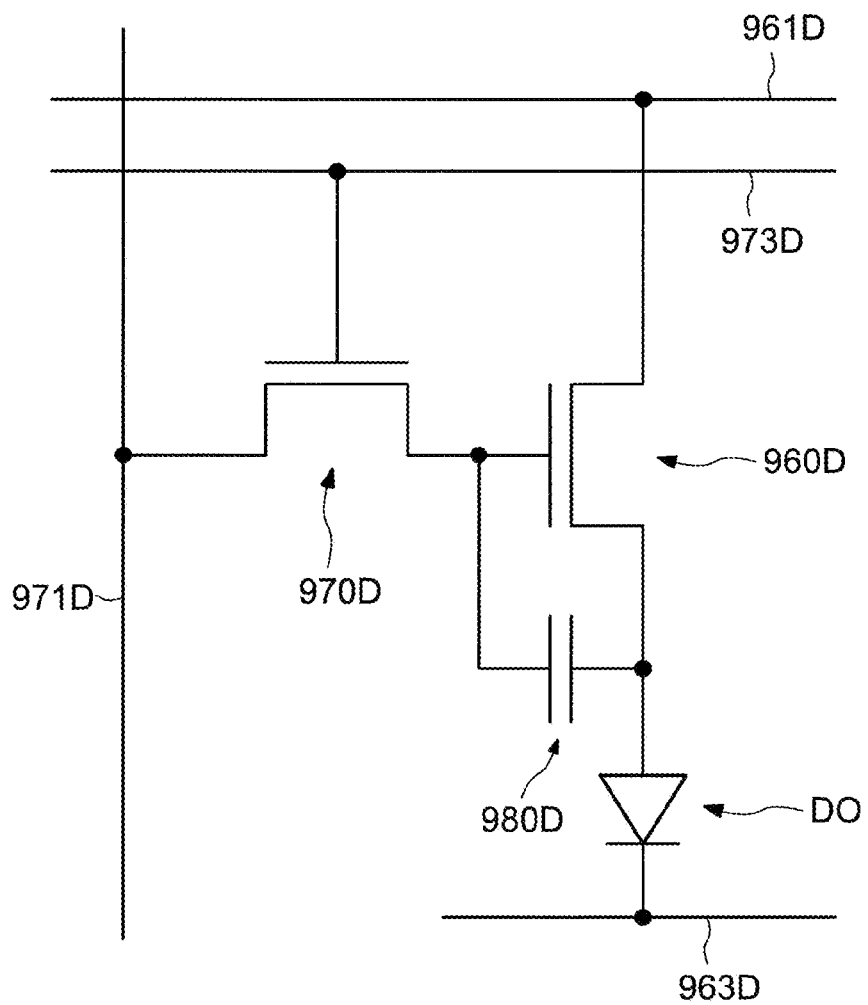
FIG. 22 is a circuit diagram showing a pixel circuit of a display device related to one embodiment of the present invention.
Figure 23:
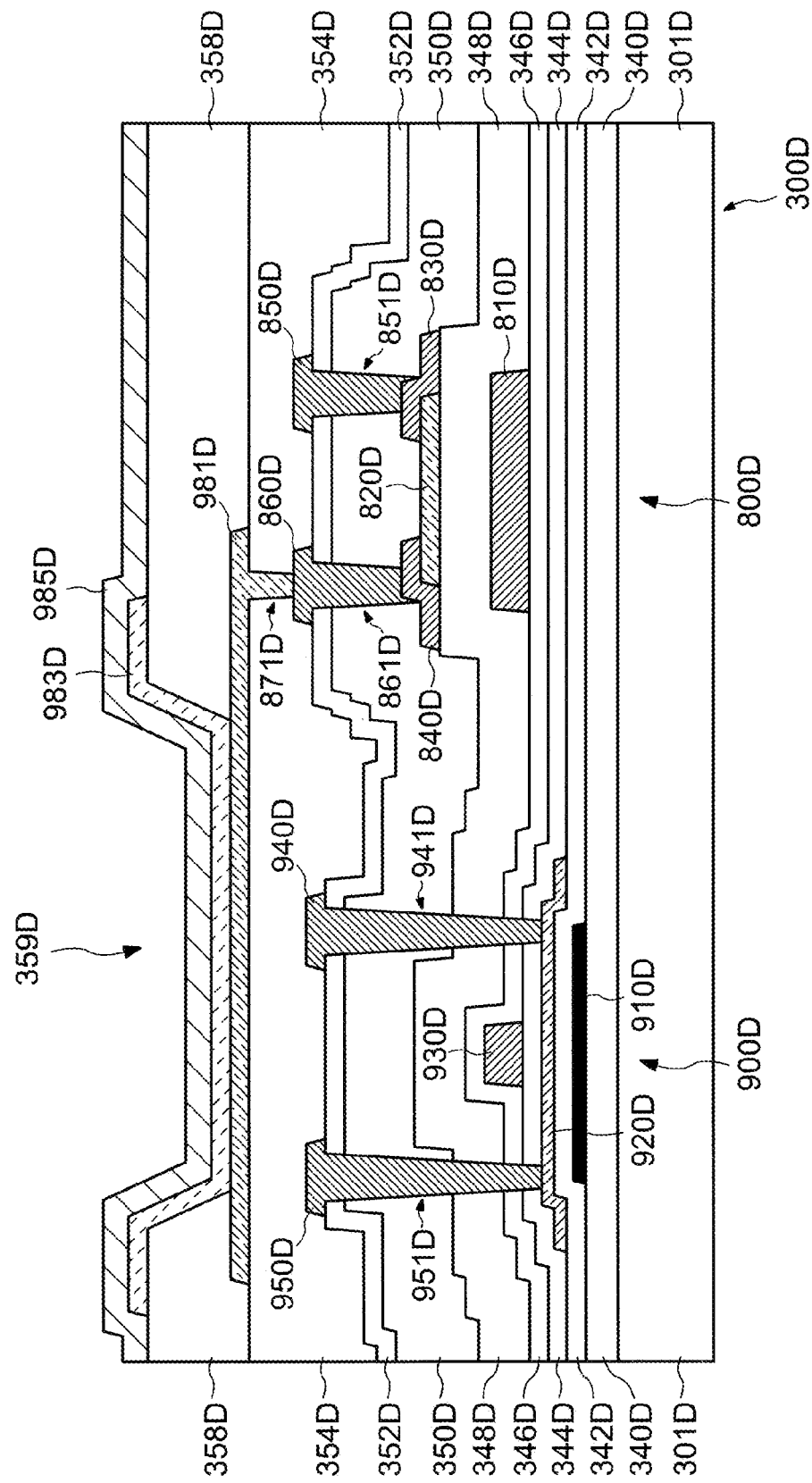
FIG. 23 is a cross-sectional diagram showing a display device related to one embodiment of the present invention.
Figure 24:
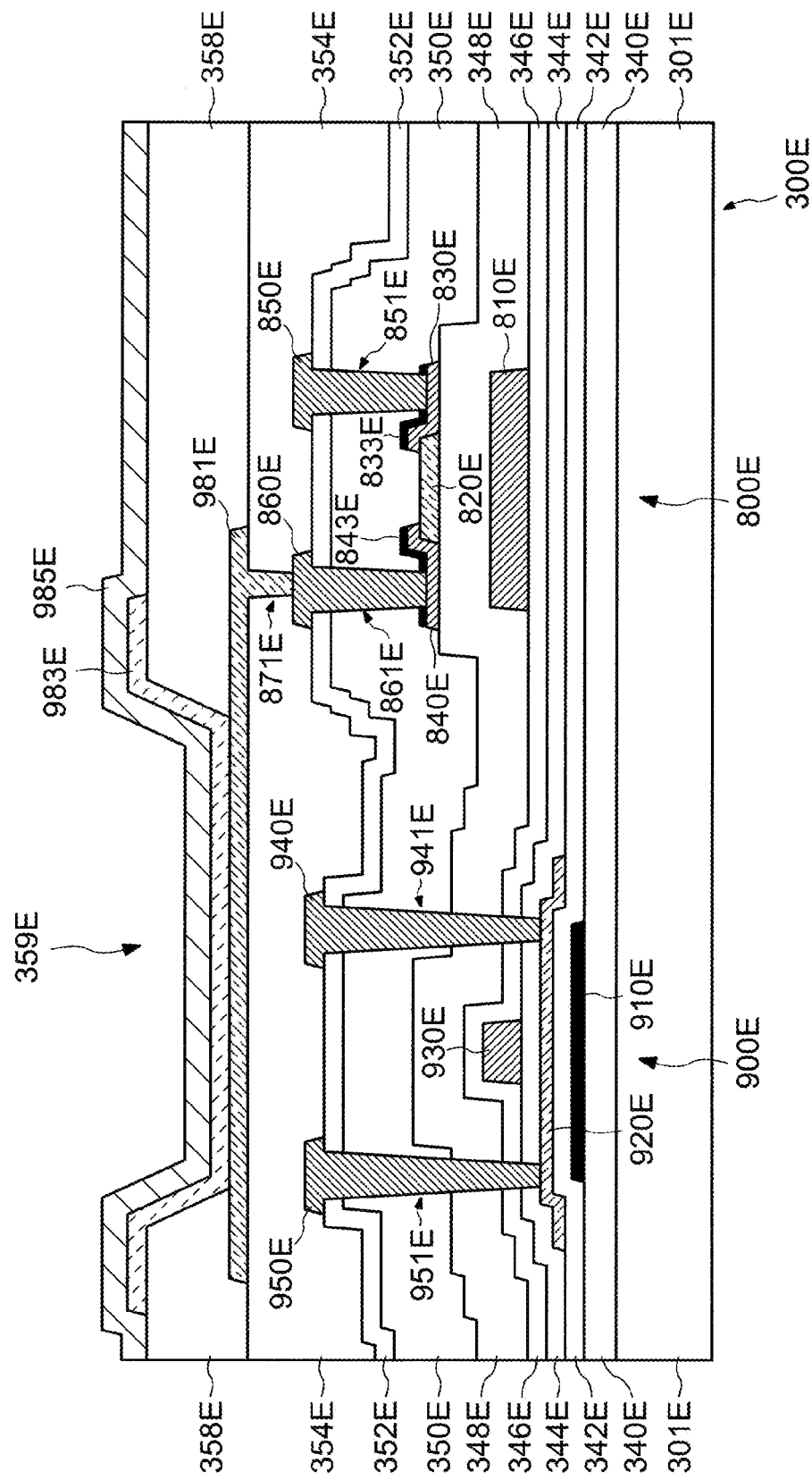
FIG. 24 is a cross-sectional diagram showing a display device related to one embodiment of the present invention.

A semiconductor device (transistor), a display device using the semiconductor device, and a manufacturing method of the display device according to one embodiment of the present invention are explained using FIG. 22 to FIG. 24. Furthermore, in the embodiment described below, a structure is explained in which the wiring structure explained in the first embodiment and the second embodiment is applied to a semiconductor device which forms a circuit of an organic EL display device. Furthermore, since a summary and circuit structure of the display device 20D are the same as those shown in FIG. 14 and FIG. 15, an explanation is omitted.

Pixel Circuit 310D of Display Device 20D

FIG. 22 is a circuit diagram showing a pixel circuit of a display device according to one embodiment of the present invention. As is shown in FIG. 22, the pixel circuit 310D includes elements such as a drive transistor 960D, a selection transistor 970D, a storage capacitor 980D and a light emitting element DO. The source electrode of the selection transistor 970D is connected to the signal line 971D, and the gate electrode of the selection transistor 970D is connected to the gate line 973D. The source electrode of the drive transistor 960D is connected to an anode power supply line 961D, and the drain electrode of the drive transistor 960D is connected to one end of the light emitting element DO. The other end of the light emitting element DO is connected to a cathode electrode 963D. The gate electrode of the driving transistor 960D is connected to the drain electrode of the selection transistor 970D. The storage capacitor 980D is connected to the gate electrode and the drain electrode of the drive transistor 960D. A gradation signal for determining the light emitting intensity of the light emitting element DO is supplied to the signal line 971D. A signal for selecting a pixel row in which the gradation signal described above is written is supplied to the gate line 973D.

Cross-Sectional Structure of Display Device 20D

FIG. 23 is a cross-sectional diagram of a display device according to one embodiment of the present invention. Although the structure of the display device 20D shown in FIG. 23 is similar to the display device 20B shown in FIG. 17, they are different in that the structure is further above the insulating layer 354D of the display device 20D but here the structure is above the insulating layer 354B of the display device 20B. Herein, in the structure of the display device 20D shown in FIG. 23, an explanation of the same structure as the display device 20B shown in FIG. 17 is omitted, and differences from the display device 20B are explained.

As is shown in FIG. 23, the display device 20D includes a pixel electrode 981D, a light emitting layer 983D and a common electrode 985D above the insulating layer 354D. The pixel electrode 981D is arranged above the insulating layer 354D and inside the opening 871D. An insulating layer 358D is arranged above the pixel electrode 981D. An opening 359D is arranged in the insulating layer 358D. The opening 359D corresponds to a light emitting region. That is, the insulating layer 358D defines a pixel. A light emitting layer 983D and a common electrode 985D are arranged above the pixel electrode 981D exposed through the opening 359D. The pixel electrode 981D and the light emitting layer 983D are separately arranged for each pixel. On the other hand, the common electrode 985D is arranged in common for a plurality of pixels. Different materials are used for the light emitting layer 983D depending on the display color of the pixel.

Modified Example of Fourth Embodiment

A display device 20E according to a modified example of the fourth embodiment is explained using FIG. 24. FIG. 24 is a cross-sectional diagram view showing a summary of a display device according to one embodiment of the present invention. Although the display device 20E shown in FIG. 24 is similar to the display device 20C shown in FIG. 21, they are different in that the structure above the insulating layer 354E of the display device 20E is different from the structure above the insulating layer 354C of the display device 20C. Since the structure above the insulating layer 354E of the display device 20E is the same as the structure of the display device 20D, an explanation is omitted.

In the third embodiment and fourth embodiment, although a structure was exemplified in which the wiring structure explained in the first embodiment and the second embodiment was applied to a liquid crystal display device and an organic EL display device, displays other than these display devices (for example, a self-luminous display device or an electronic paper display device other than an organic EL display device) may also be applied with the wiring structure. In addition, the wiring structure described above can be applied without any particular limitation from a small sized display device to a large sized display device.

Each embodiment described above as embodiments of the present invention can be implemented in combination as appropriate as long as they do not contradict each other. In addition, those skilled in the art could appropriately add, delete or change the design of the constituent elements based on the display device of each embodiment, or add, omit or change conditions as long as it does not depart from the concept of the present invention and such changes are included within the scope of the present invention.

Even if other actions and effects different from the actions and effects brought about by the aspects of each embodiment described above are obvious from the description of the present specification or those which could be easily predicted by those skilled in the art, such actions and effects are to be interpreted as being provided by the present invention.

What is claimed is:
1. A semiconductor device comprising:
a base layer;
an oxide semiconductor layer above the base layer, the oxide semiconductor layer having an edge;
a first conductive layer above the oxide semiconductor layer;
a first insulating layer above the first conductive layer; and
a second conductive layer above the first insulating layer,
wherein the oxide semiconductor layer forms a part of a thin film transistor,
the first conductive layer overlaps the edge of the oxide semiconductor layer in a plan view and has a step tracing the edge of the oxide semiconductor layer in a cross sectional view,
the first conductive layer is directly in contact with the edge and an upper surface of the oxide semiconductor layer,
the first insulating layer has a first opening overlapping the edge of the oxide semiconductor layer in the plan view,
the first opening exposes the first conductive layer,
the second conductive layer overlaps the first opening and the edge of the oxide semiconductor layer in the plan view and is directly in contact with the first conductive layer at the first opening, the first insulating layer has an upper surface in contact with the second conductive layer and a bottom surface, the upper surface of the first insulating layer has a first upper surface overlapping the oxide semiconductor layer and a second upper surface not overlapping the oxide semiconductor layer, and a first distance between the base layer and the first upper surface is larger than a second distance between the base layer and the second upper surface, wherein the first conductive layer is a source electrode or a drain electrode of a transistor, the first conductive layer includes a first film, a second film below the first film and a third film below the second film, a part of a surface of the first film on the second film side is exposed from the second film, and the second conductive layer directly contacts the third film at the first opening, further comprising:

a gate electrode opposing the oxide semiconductor layer;

a gate insulating layer between the oxide semiconductor layer and the gate electrode; and a third conductive layer connected to the oxide semiconductor layer, wherein the oxide semiconductor layer is connected to the first conductive layer, and the oxide semiconductor layer is arranged between the first conductive layer and the third conductive layer.

2. The semiconductor device according to claim 1, wherein the first conductive layer includes a first film and a second film below the first film, and a part of a surface of the first film on the second film side is exposed from the second film.

3. The semiconductor device according to claim 2, wherein the first conductive layer further includes a third film below the second film, and the second conductive layer contacts the third film.

4. The semiconductor device according to claim 2, wherein a gap is arranged between the second film and the second conductive layer.

* * * * *